(12) United States Patent
Zhang et al.

(10) Patent No.: US 12,237,803 B2
(45) Date of Patent: Feb. 25, 2025

(54) POWER-GENERATING BUILDING MATERIALS AND PREPARATION PROCESS THEREOF

(71) Applicant: Photon Technology (Kunshan) Co., LTD, Jiangsu (CN)

(72) Inventors: Wei Zhang, Jiangsu (CN); Yongwu Li, Jiangsu (CN)

(73) Assignee: Photon Technology (Kunshan) Co., LTD, Jiangsu (CN)

( * ) Notice: Subject to any disclaimer, the term of this patent is extended or adjusted under 35 U.S.C. 154(b) by 411 days.

(21) Appl. No.: 17/427,514

(22) PCT Filed: Sep. 9, 2019

(86) PCT No.: PCT/CN2019/104876
§ 371 (c)(1),
(2) Date: Sep. 15, 2021

(87) PCT Pub. No.: WO2020/155628
PCT Pub. Date: Aug. 6, 2020

(65) Prior Publication Data
US 2022/0140773 A1 May 5, 2022

(30) Foreign Application Priority Data

Jan. 31, 2019 (CN) .......................... 201910097914.7
Jan. 31, 2019 (CN) .......................... 201910097919.X
(Continued)

(51) Int. Cl.
*H02S 20/26* (2014.01)
*H02S 40/20* (2014.01)

(52) U.S. Cl.
CPC .............. *H02S 20/26* (2014.12); *H02S 40/20* (2014.12)

(58) Field of Classification Search
CPC .......... H02S 40/20; H02S 20/26; H02S 20/23; B32B 17/10
See application file for complete search history.

(56) References Cited

U.S. PATENT DOCUMENTS

| 4,097,309 A * | 6/1978 | Horne | ..................... H02S 20/20 |
| | | | 250/238 |
| 2010/0043871 A1 * | 2/2010 | Xia | ......................... B29C 70/58 |
| | | | 156/60 |

(Continued)

FOREIGN PATENT DOCUMENTS

| CN | 2733597 Y | 10/2005 |
| CN | 201048132 Y | 6/2007 |

(Continued)

OTHER PUBLICATIONS

English machine translation for CN 103872161 A (Year: 2014).*

(Continued)

*Primary Examiner* — Kourtney R S Carlson
(74) *Attorney, Agent, or Firm* — Seed IP Law Group LLP

(57) ABSTRACT

Disclosed are a power-generating building material and a preparation process thereof. The power-generating building material applies the artistic appreciation and protection performance of an optical adjustment layer to the field of solar cells, so that the architectural art and power-generating performance are integrated to meet the requirements for green buildings and environmentally friendly buildings. The outer surface formed by a surface layer after curing is beautiful in texture. The power-generating building material has the texture and quality of a building material, is rich and diverse in expression form, without changing the architectural style and urban landscape, and has a broad application prospect.

8 Claims, 21 Drawing Sheets

(30) Foreign Application Priority Data

| Jan. 31, 2019 | (CN) | 201910097926.X |
| Jan. 31, 2019 | (CN) | 201910098346.2 |
| Jan. 31, 2019 | (CN) | 201910098347.7 |
| Jan. 31, 2019 | (CN) | 201910098475.1 |

(56) References Cited

U.S. PATENT DOCUMENTS

| | | | |
|---|---|---|---|
| 2011/0030761 A1* | 2/2011 | Kalkanoglu | H02S 20/23 29/897.3 |
| 2011/0048530 A1 | 3/2011 | Marjanovic | |
| 2013/0002851 A1 | 1/2013 | Hall, Jr. et al. | |
| 2015/0059846 A1* | 3/2015 | Shiraishi | C08K 3/36 428/323 |
| 2015/0114457 A1* | 4/2015 | Weigel | B32B 27/08 156/301 |
| 2016/0049904 A1 | 2/2016 | Sasaki | |
| 2019/0393371 A1* | 12/2019 | Ursing | B32B 15/085 |
| 2020/0295705 A1* | 9/2020 | Onozaki | C03C 8/14 |

FOREIGN PATENT DOCUMENTS

| | | | | |
|---|---|---|---|---|
| CN | 201809879 U | | 4/2011 | |
| CN | 102484144 A | | 5/2012 | |
| CN | 202689259 U | | 1/2013 | |
| CN | 103782161 A | | 5/2014 | |
| CN | 103872161 A | * | 6/2014 | ......... H01L 31/0547 |
| CN | 108409133 A | | 8/2018 | |
| CN | 208111462 U | | 11/2018 | |
| CN | 109707126 A | | 5/2019 | |
| CN | 109801988 A | | 5/2019 | |
| CN | 109801989 A | | 5/2019 | |
| CN | 109860316 A | | 6/2019 | |
| CN | 109888048 A | | 6/2019 | |
| CN | 109904244 A | | 6/2019 | |
| JP | S60-148172 A | | 8/1985 | |
| JP | 2002-222974 A | | 8/2002 | |
| JP | 2005-101381 A | | 4/2005 | |
| JP | 2012-508472 A | | 4/2012 | |
| JP | 2013-16748 A | | 1/2013 | |
| JP | 2013-194503 A | | 9/2013 | |
| JP | 2014216492 A | | 11/2014 | |
| WO | 2008/012079 A1 | | 1/2008 | |
| WO | WO-2019116858 A1 | * | 6/2019 | ........... C03C 17/007 |

OTHER PUBLICATIONS

Sahouane, Nordine, et al. "Realization and modeling of multilayer antireflection coatings for solar cells application." Materials Research Express, vol. 5, No. 6, 2018, p. 065515, https://doi.org/10.1088/2053-1591/aaca16. (Year: 2018).*

* cited by examiner

POWER-GENERATING BUILDING MATERIALS AND PREPARATION PROCESS THEREOF

CROSS-REFERENCE TO RELATED APPLICATIONS

The present disclosure claims the priorities of the Chinese patent application No. 201910097926.X, No. 201910097919.X, No. 201910098475.1, No. 201910098347.7, No. 201910098346.2 and No. 201910097914.7 filed on Jan. 31, 2019, which are hereby incorporated by reference in their entirety.

FIELD

The present disclosure relates to the technical field of photovoltaic building integration, in particular to a power-generating building material and a preparation process thereof.

BACKGROUND

At present, environmental problems are increasingly serious. In order to reduce greenhouse gas emissions generated by conventional fossil energy combustion, the promotion of new energy has become a current global consensus. Solar energy is the main force of the new energy source, which is inexhaustible and has the potential for future energy topics. However, solar energy is rarely applied in urban areas. The main reason is that the appearance of the existing solar product basically presents monotonic black, gray, blue and other colors. A large-scale application does not meet the aesthetic appearance of the buildings and will damage the urban landscape. Therefore, the problem that the building integrated photovoltaics (BIPV) existing between the photovoltaic field and the building field is not resolved all the time. However, about 70% of the global energy consumption occurs in the urban areas. Therefore, only the solar energy is widely used in the urban areas, i.e. realization of the building integrated photovoltaics (BIPV) is the most effective way for large-scale development and application of solar energy.

The best mode for realizing the building integrated photovoltaics (BIPV) is the installation of a novel building material with a power-generating function, which is referred to as a power-generating building material, on the external vertical surface, the roof and the ground of the building receiving solar irradiation. The power-generating building material firstly comprises a solar cell, which can convert light energy into electric energy. The quality and texture of the surface of the power-generating building material must be consistent with the traditional building material products, such as marble, granite and ceramic tiles. Meanwhile, such a surface layer should also have high light transmittance characteristics, so that a high proportion of solar energy can directly reach the internal solar cell to perform photoelectric conversion. Finally, the power-generating building material must meet the requirements of building material attributes, such as hardness, strength, weather resistance, corrosion resistance, water absorption rate and the like, and meet the requirements of ordinary building materials. Using such a power-generating building material instead of the conventional building exterior wall, roof and ground does not affect aesthetic qualities of the urban and building landscape, normally continues the culture and history of cities, and conforms to public aesthetic.

Based on the above, the patent application CN200420085961 uses different thicknesses and kinds of optical anti-reflection coatings, so that the crystalline silicon solar cell exhibits different colors. The patent application CN201020272089 adds an optical medium film layer between the glass substrate and the transparent conductive film, so that the optical medium film layer, the transparent glass substrate, the transparent conductive film and the amorphous silicon film form a passive filter system capable of selectively reflecting and absorbing the solar spectrum. When the angle of incidence changes, the color of the curtain wall glass will change, that is, the color of the curtain wall glass seen from the front and side views may not be the same. The patent application CN201220200568 changes the color of EVA or PVB glue film to match the color of the building on the premise of not changing the cell sheet.

Although the above-mentioned patents may render the photovoltaic component colorful and broaden the application range of the photovoltaic component, the texture presented by these photovoltaic components is similar to glass, which is simple. These shortcomings still limit the application of photovoltaic components in the field of buildings. Moreover, as the photovoltaic component still uses tempered glass as a packaging protective surface layer, light pollution, such as flash, dizziness and the like, caused by specular reflection still exists. As a result, the above-described photovoltaic components are still unable to be widely used in the field of buildings.

SUMMARY

Based on the above-mentioned issues, the improvement of the thickness, the formula and the process method in the preparation process can enable the material to have high light transmission performance. At the same time, in the preparation process, the optical adjustment layer can have a certain haze, that is, the light penetrates through the optical adjustment layer to deflect at different angles and can still be absorbed by the power-generating layer. However, people cannot see the surface color of the battery assembly under the protective layer. The material has both good decorative effects and good optical transmittance, referred to as an "optical adjustment layer".

The optical adjustment layer is used as the protective layer of the solar cell, which has the protection effects on the solar cell assembly and the aesthetic effects on the power-generating panel. Through the improvement of the thickness, the formula and the process method, the optical adjustment layer has certain light transmittance and haze, which can effectively power the electric appliances in the building and reduce the energy consumption of the building.

The specific technical solutions of the present disclosure are as follows:

The present disclosure relates to a power-generating panel with an appearance of a building material, wherein the power-generating panel with an appearance of a building material has an optical adjustment layer, the optical adjustment layer is a translucent medium material, a weighted average transmittance is 10% to 85% in a wavelength range of 380 nm to 1,250 nm, and a haze is 10% to 95%; and the power-generating panel with an appearance of a building material comprises a substrate, a power-generating layer and the optical adjustment layer.

Preferably, the power-generating layer is bonded to the optical adjustment layer by a glue film. The optical adjustment layer is directly deposited on the substrate or bonded to the substrate by a glue film.

Preferably, the glue film comprises ethylene-vinyl acetate copolymer (EVA), polyvinyl butyral (PVB), polyethylene-butylene copolymer (POE) or silica gel.

Preferably, the raw material of the optical adjustment layer comprises a light diffusing agent. The atomization scattering effect can be generated by the light diffusing agent, so that most of the transmitted light beams are deflected in different directions. Therefore, the film layer under the optical adjustment layer cannot be seen visually, while the higher transmittance is maintained.

Preferably, the light diffusing agent comprises one or more of polymethyl methacrylate, polystyrene and silicone. Most of the photons can penetrate these light diffusing agent materials themselves. The refractive index of the light diffusing agent is close to the refractive index of the resin medium dispersing light diffusing agent. Although the light is refracted several times, the loss of transmitted light is less, and a higher transmission effect is achieved. Meanwhile, because the light rays are refracted several times, the direction of the emergent light penetrating through the optical adjustment layer and the direction of the incident light are deflected, and the solar cell layer under the optical adjustment layer cannot be visually seen, which shields the appearance of the solar cell.

Preferably, the thickness of the optical adjustment layer is 0.1 mm to 20 mm.

Preferably, the optical adjustment layer material comprises one or more of light-transmitting ceramic, ultra-thin stone, color crystal and artificial light-transmitting resin plate.

Preferably, the thickness of the ultra-thin stone is 0.5 mm to 5 mm.

Preferably, the optical adjustment layer further comprises a color-glazed glass.

Preferably, the percentage of water vapor permeation of the optical adjustment layer is 0% to 0.5%, and the hardness is 4 to 9H. When the power-generating panel is used in a region with a large air humidity, such as the southeast coast of China, south Yunnan, Jiangnan hilly areas, Sichuan, Guizhou, and some areas in Hainan Island, the air humidity is greater than 80%. Therefore, the percentage of water vapor permeation of the power-generating panel is strict, and the percentage of water vapor permeation of the power-generating panel is preferably 0%. When the power-generating panel is used in a region with a small air humidity, such as inland basin in northwestern China, Tibetan plateau, and the like, the air humidity is less than 30%. Therefore, the percentage of water vapor permeation of the power-generating panel is loose. Similarly, a power-generating panel with a high hardness is preferably used in a region, where the climate is severe and disaster weather frequently occurs, while a power-generating panel with a lower hardness may be used in a region, where the climate is mild and stable.

Preferably, the substrate comprises one or more of glass, metal plates, cement-based plates, stone, concrete, tile, ceramics, engineering plastics and the like. The power-generating layer comprises monocrystalline silicon solar cell sheet, polycrystalline silicon solar cell sheet, copper indium gallium selenide solar cell, gallium arsenide solar cell, amorphous silicon solar cell, cadmium telluride solar cell, dye-sensitized solar cell, a copper zinc tin sulfur solar cell or perovskite solar cell.

The present disclosure provides a process for preparing a power-generating panel with a building material appearance, comprising following:

attaching a power-generating layer to a substrate, and extracting positive and negative poles, or directly preparing a power-generating layer on a substrate, and extracting positive and negative electrodes;

preparing an optical adjustment layer by high-temperature sintering, annealing, organic synthesis, sticking, pressing or printing, and performing surface processing on the optical adjustment layer, of which a size matches with the power-generating layer; and sequentially stacking a glue film and the optical adjustment layer on the power-generating layer, and performing lamination packaging to obtain the power-generating layer.

Preferably, if a monocrystalline silicon solar cell sheet or a polycrystalline silicon solar cell sheet is used as a power-generating layer, the substrate surface is cleaned, a glue film layer is arranged on the surface of the substrate, the monocrystalline silicon solar cell sheet or the polycrystalline silicon solar cell sheet is arranged on the surface of the glue film, and the positive and negative poles are led out.

Preferably, the processing of the surface of the optical adjustment layer comprises performing an optical polishing process and a hydrophobic treatment on the surface of the optical adjustment layer.

Preferably, the temperature of the high temperature sintering is 120° C. to 620° C.

Preferably, the packaging process comprises: a) laying a glue film, leaving 10 mm to 15 mm in length on each side; b) extracting the bus bar and conducting appearance and electrical inspection; c) fully covering the substrate or the optical adjustment layer up and down, putting into a laminating machine, and vacuumizing to below 0.01 Pa; d) the curing temperature being 70° C. to 175° C., and the curing time being 5 to 30 min; and e) after the lamination process is completed, taking out.

Preferably, when the optical adjustment layer is a light-transmitting ceramic sheet, the percentage of water vapor permeation is 0% to 0.5%, and the hardness is 6 to 9H.

In the surface processing: polishing and hydrophobizing the surface of the sintered product to form a light-transmitting ceramic sheet with good light transmission performance and attraction.

Preferably, the post-sintered product is hydrophobized. The light-transmitting ceramic sheet is immersed in absolute ethanol containing cetyltrimethoxysilane, and then the immersed light-transmitting ceramic is dried at 75° C. to 100° C. for 7 to 10 h.

Glazing treatment is performed on the surface of the light-transmitting ceramic. The glazing treatment is well-known in the art.

In the glazing process, the surface of the sintered product is dried and cleaned. The pattern on the surface is obtained by printing, glaze spraying, glaze brushing and the like. The prepared color light-transmitting ceramic has strong compactness, corrosion resistance and high hardness.

The surface of the power-generating layer is covered with the prepared light-transmitting ceramic as an optical adjustment layer. The power-generating layer and the optical adjustment layer are adhered by EVA, PVB and the like, sealed by lamination and insulated from each other. Therefore, the solar cell is isolated from the water vapor. A power-generating panel with light-transmitting ceramic optical adjustment layer was prepared.

Preferably, when the optical adjustment layer is a layer of ultra-thin stone, the thickness is 0.1 mm to 5 mm. The percentage of water vapor permeation is 0% to 0.5% and the hardness is 6 to 8H. The preparation process is as follows:

Selecting shale or sediment rock as stone material and polishing and cleaning the surface of the stone material;

Coating the curing glue on the polished surface of the stone material and covering a layer of glass fiber cloth on its surface;

Standing at 25° C. to 300° C. for 10 min to 1 h to cure the glue;

Repeating the above steps once;

Tearing off the glass fiber cloth from the stone substrate by mechanical means to obtain the glass fiber cloth with the stone surface and polishing the surface of the torn stone away from the fiber cloth; and Separating the glass fiber cloth and the torn stone material with the acetone solution.

Preferably, the curing glue is a room-temperature curing glue, such as epoxy resin, polyurethane resin glue and the like; and a high-temperature curing glue, such as silicone, phenolic resin glue, urea-formaldehyde resin glue, polyimide glue and the like.

Hydrophobic treatment is performed on the ultra-thin stone product to obtain the ultra-thin stone optical adjustment layer with good light transmission performance and appreciated appearance.

The surface of the power-generating layer is covered with the prepared optical adjustment layer. The power-generating layer and the optical adjustment layer are adhered by glue such as EVA, PVB, POE and the like, sealed by lamination and insulated from each other. The solar cell is isolated from the water vapor. A power-generating panel with ultra-thin stone is prepared.

The ultra-thin stone prepared in the present disclosure has strong corrosion resistance and high hardness and no harm to human bodies. The ultra-thin stone has a rock aesthetic appearance with good decorative properties.

Preferably, when the optical adjustment layer is a layer of an artificial light-transmitting resin sheet, the thickness is 1 mm to 20 mm. The percentage of water vapor permeation is 0% to 0.5% and the hardness is 4 to 8H. The preparation process comprises the following steps: powder preparation, molding, curing and surface processing.

The powder comprises, in parts by weight, 20 to 40 parts of unsaturated polyester resin, 16 to 30 parts of silicone resin, 1 to 3 parts of cross-linking agent, 0.1 to 1 part of color paste, 14 to 22 parts of aluminum hydroxide, 10 to 20 parts of calcium carbonate, 0.5 to 3 parts of accelerator, 3 to 5 parts of titanium dioxide and 1 to 3 parts of curing agent.

The cross-linking agent is one or more of benzoyl peroxide, di-tert-butyl peroxide, diethylenetriamine and polystyrene.

The accelerator is one or more of triethylene diamine, ferric trichloride, zinc isooctanoate and dibutyltin dilaurate.

The curing agent is one or more of vinyltriamine and ethylenediamine.

Moreover, sodium tripolyphosphate can be added as a dispersing agent. A silicone light diffusing agent is added to generate atomization scattering effect.

The color paste comprises, in parts by weight, 0.1 to 1 part of inorganic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow and iron blue.

Preferably, the color paste may comprise, in parts by weight, an organic pigment. The organic pigment is 0.1 to 1 part by weight. The organic pigment comprises one or more of azo pigment, phthalocyanine pigment, triarylmethane pigment and polycyclic pigment.

The above powder materials are stirred and mixed in a vacuum blander to according to the thickness of the required optical adjustment layer to obtain a stirred and uniform unsaturated polyester resin mixture.

Molding: weighing a certain weight of the powders according to the thickness requirement, putting the powders into a mold for casting molding in vacuum.

Curing: standing at 20° C. to 100° C. for 1 to 5 h for curing and molding to forming a green body with desired shape (plate-type).

Surface processing: The green body product is subject to optical grinding and polishing treatment and hydrophobization treatment to form an artificial light-transmitting resin plate with good light transmission performance and appreciated appearance.

The artificial light-transmitting resin plate prepared in the present disclosure has strong compactness, corrosion resistance and hardness and no harm to human bodies.

The surface of the power-generating layer is covered with the prepared optical adjustment layer. The power-generating layer and the optical adjustment layer are adhered with EVA, PVB and the like, sealed by lamination and insulated from each other. Therefore, the solar cell is isolated from the water vapor. A power-generating panel with an artificial light-transmitting resin plate is prepared.

Preferably, when the optical adjustment layer is a layer of color-glazed glass, it comprises a substrate and a glaze layer. The substrate is a building glass and has a thickness of 0.1 mm to 10 mm. The specific steps of preparing the glaze layer comprises slurry preparation, printing and coating, drying and sintering.

Slurry preparation: The slurry comprises, in parts by weight, 70 to 75 parts of albite, 15 to 20 parts of quartz stone, 3 to 6 parts of calcium carbonate, 3 to 8 parts of talcum powder, 10 to 20 parts of calcium silicate, 3 to 4 parts of aluminum oxide, 1 to 5 parts of sodium hydroxide and 0.1 to 1 part of color paste.

The color paste comprises 0.1 to 1 part of inorganic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow and iron blue.

Preferably, the color paste can comprise, in parts by weight, an organic pigment. The organic pigment is 0.1 to 1 part. The organic pigment comprises azo pigment, phthalocyanine pigment, triarylmethane pigment and polycyclic pigment. The above materials are added to water. The size of the added solids is reduced by means of ball milling. The added solids are uniformly distributed in water to form a slurry. The mixture is stirred uniformly.

The slurry is coated on the industrial glass in a printing manner. The coating thickness is 0.01 mm to 5 mm. Different spray heads can be used during printing. A heating air gun was arranged beside the spray head, so that no flow marks occurred. The spray heads had more accurate control on the flow rate of the printing slurry.

The glass coated with the slurry is then placed in an oven and dried. The baking temperature is 25° C. to 100° C. and the baking time is 30 min to 2 h.

The dried slurry/glass is then placed in a kiln for baking at 550° C. to 750° C. for 1 to 8 h.

The surface of the power-generating layer is covered with the prepared optical adjustment layer. The power-generating layer and the optical adjustment layer are adhered by EVA or PVB, sealed by lamination and insulated from each other. The solar cell is isolated from the water vapor. A power-generating panel with color-glazed glass is prepared.

Compared with the prior art, the power-generating panel with the building material appearance of the present disclosure has the following advantages:

1) The solar cell and the optical adjustment layer are properly combined to prepare the power-generating panel, which has good power-generating effect and strong decorative property.

2) The optical adjustment layer is used in the present disclosure, so that the high hardness is achieved and the guarantee is provided for the application of the solar assembly outdoors. Meanwhile, the high transmittance and the haze are achieved. The conversion efficiency of the power-generating plate is relatively high.

3) The optical adjustment layer of the present disclosure has good hydrophobic performance, which further improves the service life of the cell.

4) The optical adjustment layer used in the present disclosure has the characteristics of high bonding force and high weather resistance.

Furthermore, the present disclosure provides a power-generating panel, comprising a substrate, a power-generating layer and an optical adjustment layer, wherein the optical adjustment layer consists of an optical medium phase and a texture phase, the texture phase is dispersed in the optical medium phase or the texture phase is distributed on a surface of the optical medium; and the optical adjustment layer has a weighted average transmittance of 10% to 85% in a wavelength range of 380 nm to 1,250 nm, and the thickness of the optical adjustment layer is 0.01 mm to 10 mm.

Preferably, the optical adjustment layer has a weighted average transmittance of 40% to 85% in the wavelength range of 380 nm to 1,250 nm and a percentage of water vapor permeation of 0% to 0.5%, a hardness of 4 to 9H. When the power-generating panel is used in a region with a large air humidity, such as the southeast coast of China, south Yunnan, Jiangnan hilly areas, Sichuan, Guizhou, and some areas in Hainan Island, the air humidity is greater than 80%. Therefore, the percentage of water vapor permeation of the power-generating panel is strict, and the percentage of water vapor permeation of the power-generating panel is preferably 0%. When the power-generating panel is used in a region with a small air humidity, such as inland basin in northwestern China, Tibetan plateau, and the like, the air humidity is less than 30%. Therefore, the percentage of water vapor permeation of the power-generating panel is loose. Similarly, a power-generating panel with a high hardness is preferably used in a region, where the climate is severe and disaster weather frequently occurs, while a power-generating panel with a lower hardness may be used in a region, where the climate is mild and stable.

Preferably, the medium phase comprises one or more of quartz, glass, resin, transparent ceramic and crystal material. The medium phase material has a higher transmittance in the wavelength range of 380 nm to 1,250 nm, which is beneficial to preparation of a power-generating plate with high conversion efficiency.

Preferably, the texture phase comprises one or more of marble, granite, shale and sandstone. The texture phase may be a natural stone material or a natural-like stone material.

Preferably, the optical adjustment layer comprises one or more of color-glazed glass, ultra-thin stone and artificial light-transmitting resin plate. The color-glazed glass is formed by adhering the texture phase of the color-glazed layer to the surface of the glass medium phase with high photon transmittance. The ultra-thin stone is formed by adhering the texture phase of the natural shale stone to the surface of the glass or resin medium phase with high photon transmittance. Preferably, the thickness of the ultra-thin stone is 0.05 mm to 2 mm. The artificial light-transmitting resin plate is formed by dispersing the texture phase of the natural stone in the resin.

Preferably, a light diffusing agent is added to the medium phase of the optical adjustment layer.

Preferably, the light diffusing agent is an organic light diffusing agent and comprises one or more of polymethyl methacrylate, polystyrene and silicone. These light diffusing agent materials are themselves transparent to most of the photons. The refractive index of the light diffusing agent is close to the refractive index of the resin medium that disperses the light diffusing agent. Although the light is refracted multiple times, the loss of transmitted light is less and a high transmission effect is achieved. Meanwhile, because the light is refracted multiple times, the direction of the emergent light penetrating the optical adjustment layer is deflected to the direction of the incident light, so that the solar cell layer under the optical adjustment layer cannot be visually seen, which shields the appearance of the solar cell.

Preferably, the textured phase further comprises a coloring material. These coloring materials themselves have a certain color, or form a particular color after being added to the optical medium phase.

Preferably, the coloring material comprises one or more of strontium sulfide, cerium oxide, cobalt oxide, silver, copper oxide, cuprous oxide, iron oxide, manganese oxide and selenium oxide.

Preferably, the coloring material comprises one or more of pigment and dye.

Preferably, the dye is distributed in an optical medium phase, which can exhibit an appearance of high transparency and high coloring force.

Preferably, the pigment has a refractive index of 1.4 to 2.5. The refractive index of the pigment is preferably similar to that of the optical medium phase. If the refractive index of the pigment is too high, the transparency can be adversely affected.

Preferably, the substrate comprises one or more of glass, metal plates, cement-based plates, stone, concrete, tiles, ceramics, engineering plastics and the like.

The power-generating layer comprises monocrystalline silicon solar cell sheet, polycrystalline silicon solar cell sheet, copper indium gallium selenide solar cell, gallium arsenide solar cell, amorphous silicon solar cell, cadmium telluride solar cell, dye-sensitized solar cell, copper zinc tin sulfur solar cell or perovskite solar cell.

Preferably, the power-generating layer further comprises a glue film. The power-generating layer is bonded to the optical adjustment layer by a glue film. When the power-generating layer is a monocrystalline silicon solar cell sheet or a polycrystalline silicon solar cell sheet, the cell piece and the substrate are bonded by a glue film.

Preferably, the glue film comprises any one of hot melt colloid and non-acidic colloid.

The present disclosure provides a process for preparing a power-generating plate with an optical adjustment layer, comprising:

attaching a power-generating layer to a substrate, extracting the positive and negative electrodes, or directly preparing the power-generating layer on a substrate and extracting the positive and negative electrodes;

preparing an optical adjustment layer by preparing a texture phase on a surface of the medium phase of the optical adjustment layer via coating and curing at room temperature or coating and annealing at a high temperature; or by adding a substance required to form a texture phase into the raw material of the medium phase during preparation of the medium phase;

performing surface processing and side surface processing on the optical adjustment layer to adapt a flatness and a size of the optical adjustment layer to the power-generating layer; and sequentially stacking a glue film and the optical adjustment layer on a light receiving surface of the power-generating layer, and performing lamination packaging to obtain the power-generating panel with an optical adjustment layer.

Preferably, the temperature of the high temperature anneal is 120° C. to 620° C.

Preferably, the processing of the surface of the optical adjustment layer comprises performing an optical grinding and polishing treatment and a hydrophobization treatment on the surface of the optical adjustment layer.

Preferably, the packaging process comprises: a) laying a glue film, leaving 10 mm to 15 mm in length on each side; b) extracting the bus bar and conducting appearance and electrical inspection; c) fully covering the substrate or the optical adjustment layer up and down, putting into a laminating machine, and vacuumizing to below 0.01 Pa; d) the curing temperature being 70° C. to 175° C., and the curing time being 5 to 30 min; and e) after the lamination process is completed, taking out.

Preferably, when the optical adjustment layer is a transparent ceramic sheet, the thickness is 0.1 mm to 5 mm. The percentage of water vapor permeation is 0% to 0.5% and the hardness is 6 to 9H.

In the surface processing: polishing and hydrophobizing the surface of the sintered product to form a light-transmitting ceramic sheet with good light transmission performance and attraction.

Preferably, the post-sintered product is hydrophobized. The light-transmitting ceramic sheet is immersed in absolute ethanol containing cetyltrimethoxysilane, and then the immersed light-transmitting ceramic is dried at 75° C. to 100° C. for 7 to 10 h.

Glazing treatment is performed on the surface of the light-transmitting ceramic. The glazing treatment is well-known in the art.

In the glazing process, the surface of the sintered product is dried and cleaned. The pattern on the surface is obtained by printing, glaze spraying, glaze brushing and the like. The prepared color light-transmitting ceramic has strong compactness, corrosion resistance and high hardness.

The surface of the power-generating layer is covered with the prepared light-transmitting ceramic as an optical adjustment layer. The power-generating layer and the optical adjustment layer are adhered by EVA, PVB and the like, sealed by lamination and insulated from each other. Therefore, the solar cell is isolated from the water vapor. A power-generating panel with light-transmitting ceramic optical adjustment layer was prepared.

Preferably, when the optical adjustment layer is a layer of ultra-thin stone, the thickness is 2 mm to 20 mm. The percentage of water vapor permeation is 0% to 0.5% and the hardness is 6 to 8H. The preparation process is as follows:

Selecting shale or sediment rock as stone material and polishing and cleaning the surface of the stone material;

Coating the curing glue on the polished surface of the stone material and covering a layer of glass fiber cloth on its surface;

Standing at 25° C. to 300° C. for 10 min to 1 h to cure the glue;

Tearing off the glass fiber cloth from the stone substrate by mechanical means to obtain the glass fiber cloth with the stone surface and polishing the surface of the torn stone away from the fiber cloth; and Separating the glass fiber cloth and the torn stone material with the acetone solution.

Preferably, the curing glue is a room-temperature curing glue, such as epoxy resin, polyurethane resin glue and the like; and a high-temperature curing glue, such as silicone, phenolic resin glue, urea-formaldehyde resin glue, polyimide glue and the like.

Hydrophobic treatment is performed on the ultra-thin stone product to obtain the ultra-thin stone optical adjustment layer with good light transmission performance and appreciated appearance.

The surface of the power-generating layer is covered with the prepared optical adjustment layer. The power-generating layer and the optical adjustment layer are adhered by glue such as EVA, PVB and the like, sealed by lamination and insulated from each other. The solar cell is isolated from the water vapor. A power-generating panel with ultra-thin stone is prepared.

The ultra-thin stone prepared in the present disclosure has strong corrosion resistance and high hardness and no harm to human bodies. The ultra-thin stone has a rock aesthetic appearance with good decorative properties.

Preferably, when the optical adjustment layer is a layer of an artificial light-transmitting resin sheet, the thickness is 1 mm to 20 mm. The percentage of water vapor permeation is 0% to 0.5% and the hardness is 4 to 8H. The preparation process comprises the following steps: powder preparation, molding, curing and surface processing.

The powder comprises, in parts by weight, 20 to 40 parts of unsaturated polyester resin, 16 to 30 parts of silicone resin, 1 to 3 parts of cross-linking agent, 0.1 to 1 part of color paste, 14 to 22 parts of aluminum hydroxide, 10 to 20 parts of calcium carbonate, 0.5 to 3 parts of accelerator, 3 to 5 parts of titanium dioxide and 1 to 3 parts of curing agent.

The cross-linking agent is one or more of benzoyl peroxide, di-tert-butyl peroxide, diethylenetriamine and polystyrene.

The accelerator is one or more of triethylene diamine, ferric trichloride, zinc isooctanoate and dibutyltin dilaurate.

The curing agent is one or more of vinyltriamine and ethylenediamine.

Moreover, sodium tripolyphosphate can be added as a dispersing agent.

The color paste comprises, in parts by weight, 0.1 to 1 part of inorganic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow and iron blue.

Preferably, the color paste may comprise, in parts by weight, an organic pigment. The organic pigment is 0.1 to 1 part by weight. The organic pigment comprises one or more of azo pigment, phthalocyanine pigment, triarylmethane pigment and polycyclic pigment.

The above powder materials are stirred and mixed in a vacuum blander to according to the thickness of the required optical adjustment layer to obtain a stirred and uniform unsaturated polyester resin mixture.

Molding: weighing a certain weight of the powders according to the thickness requirement, putting the powders into a mold for casting molding in vacuum.

Curing: standing at 20° C. to 100° C. for 1 to 5 h for curing and molding to forming a green body with desired shape (plate-type).

Surface processing: The green body product is subject to optical grinding and polishing treatment and hydrophobization treatment to form an artificial light-transmitting resin plate with good light transmission performance and appreciated appearance.

The artificial light-transmitting resin plate prepared in the present disclosure has strong compactness, corrosion resistance and hardness and no harm to human bodies.

The surface of the power-generating layer is covered with the prepared optical adjustment layer. The power-generating layer and the optical adjustment layer are adhered with EVA, PVB and the like, sealed by lamination and insulated from each other. Therefore, the solar cell is isolated from the water vapor. A power-generating panel with an artificial light-transmitting resin plate is prepared.

Preferably, when the optical adjustment layer is a layer of color-glazed glass, it comprises a substrate and a glaze layer. The substrate is a building glass and has a thickness of 0.1 mm to 10 mm. The specific steps of preparing the glaze layer comprises slurry preparation, printing and coating, drying and sintering.

Slurry preparation: The slurry comprises, in parts by weight, 70 to 75 parts of albite, 15 to 20 parts of quartz stone, 3 to 6 parts of calcium carbonate, 3 to 8 parts of talcum powder, 10 to 20 parts of calcium silicate, 3 to 4 parts of aluminum oxide, 1 to 5 parts of sodium hydroxide and 0.1 to 1 part of color paste.

The color paste comprises 0.1 to 1 part of inorganic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow and iron blue.

Preferably, the color paste can comprise, in parts by weight, an organic pigment. The organic pigment is 0.1 to 1 part. The organic pigment comprises azo pigment, phthalocyanine pigment, triarylmethane pigment and polycyclic pigment. The above materials are added to water. The size of the added solids is reduced by means of ball milling. The added solids are uniformly distributed in water to form a slurry. The mixture is stirred uniformly.

The slurry is coated on the industrial glass in a printing manner. The coating thickness is 0.01 mm to 5 mm. Different spray heads can be used during printing. A heating air gun was arranged beside the spray head, so that no flow marks occurred. The spray heads had more accurate control on the flow rate of the printing slurry.

The glass coated with the slurry is then placed in an oven and dried. The baking temperature is 25° C. to 100° C. and the baking time is 30 min to 2 h.

The dried slurry/glass is then placed in a kiln for baking at 550° C. to 750° C. for 1 to 8 h.

The surface of the power-generating layer is covered with the prepared optical adjustment layer. The power-generating layer and the optical adjustment layer are adhered by EVA or PVB, sealed by lamination and insulated from each other. The solar cell is isolated from the water vapor. A power-generating panel with color-glazed glass is prepared.

Compared with the prior art, the power-generating panel with the building material appearance of the present disclosure has the following advantages:

1) The solar cell and the optical adjustment layer are properly combined to prepare the power-generating panel, which has good power-generating effect and strong decorative property.

2) The optical adjustment layer is used in the present disclosure, so that the high hardness is achieved and the guarantee is provided for the application of the solar assembly outdoors. Meanwhile, the high transmittance and the haze are achieved. The conversion efficiency of the power-generating plate is relatively high.

3) The optical adjustment layer of the present disclosure has good hydrophobic performance, which further improves the service life of the cell.

4) The optical adjustment layer used in the present disclosure has the characteristics of high bonding force and high weather resistance.

Furthermore, for various deficiencies of photovoltaic cells in the prior art, the object of the present disclosure also comprises the provision of a photovoltaic building material in the field of buildings. The texture of the photovoltaic building material is no longer limited to the texture of the glass, but has the appearance of a natural stone such as marble, granite and the like as conventionally seen. By changing the composition of the surface layer material of the photovoltaic building material, it is possible to make the building material present various desired colorful appearances and rich textures. The photovoltaic building material can develop and utilize sufficient sunlight radiation on the building without destroying the appearance and style of the building and has a wide application prospect.

The specific technical solutions in the present disclosure are as follows.

The present disclosure provides a photovoltaic building material comprising a surface layer and a power-generating layer, wherein the surface layer has a weighted average transmittance of 30% to 85% in a wavelength range of 300 nm to 1,300 nm and a haze of 10% to 95%.

Preferably, the surface layer raw material comprises a curing mother liquor, a light diffusing agent and a coloring agent.

Preferably, the curing mother liquor comprises one or more of silicone emulsion, silicate aqueous solution, polyurethane emulsion, polyacrylic acid emulsion and high molecular polymer emulsion comprising carbon-fluorine bonds.

Preferably, the light diffusing agent comprises one or more of polymethyl methacrylate, polystyrene and silicone.

Preferably, the light diffusing agent is spherical and has a size distribution of 0.8 μm to 7 μm Preferably, the mass fraction of the light diffusing agent in the curing raw material is 0.3% to 4%.

According to the Mie theory, when the spherical particles are uniformly dispersed in the resin substrate, the scattering intensity of the system is closely related to the particle size of the particles and the refractive index of the particles with respect to the surrounding medium. Within a certain range, the larger the particle size of the particles, the greater the difference of the refractive index, the greater the scattered intensity. In the present disclosure, the light diffusing agent is an organic light diffusing agent, which itself is transparent to most of the photons. The refractive index of the light diffusing agent is close to the refractive index of the emulsion medium of the dispersed light diffusing agent. The light diffusing agent has a relative refractive index of 0.90 to 0.99 or 1.01 to 1.10. Even though a plurality of light are refracted, the loss of transmitted light is less and a high transmission effect is achieved. Meanwhile, because the light is refracted multiple times, the direction of emergent light penetrating the surface layer is deflected to the direction of incident light, so that the solar cell layer under the surface layer cannot be visually seen, which shields the appearance of the solar cell.

Preferably, the coloring agent comprises one or more of pigment and dye.

Preferably, after the dye is mixed with the mother liquor, a mixing solution with high transparency and high coloring force can be obtained.

Preferably, the refractive index of the pigment is 1.4 to 2.5. If the refractive index of the pigment is too high, the transparency can be adversely affected.

Preferably, the pigment has a particle size of less than or equal to 300 nm. When a smaller particle size of the pigment is added to the mother liquor, it is advantageous to obtain a cured mixing solution with a higher transparency in the presence of a certain color. When the particle size of the pigment is less than one quarter of the incident light wavelength, the light can be diffracted, and the particles of the pigment do not interfere with the process of the light. Therefore, the covering power of the surface layer is relatively low, while the transmittance thereof is higher.

Preferably, the coloring agent comprises a pearlescent pigment.

Preferably, the pigment comprises a thermochromic pigment and/or a photochromic pigment.

Preferably, the surface layer has a thickness of 0.02 mm to 5 mm.

Preferably, the surface layer of the photovoltaic building material prepared in the present disclosure has the water absorption rate of the surface layer of less than or equal to 8%, has no damage after 50 freeze-thaw cycles, does not cause cracking and cracks, has the artificial weathering aging resistance of more than or equal to 600 h, has the stain resistance of less than or equal to 20%, meets the requirements of chemical corrosion resistance and has the scrub resistance of more than or equal to 1000 times. The adhesion force between the protective layer of the building material and the power-generating layer is greater than or equal to 1 MP. The Mohs hardness of the protective layer of the building material is greater than or equal to 3. The surface layer meets the performance requirements in the building field.

Preferably, the power-generating layer is a solar cell component and comprises one of a crystalline silicon solar cell component or a thin film solar cell component. The crystalline silicon solar cell component is a commercially available product and comprises a substrate, a glue film, a solar cell layer and a protective layer. The thin film solar cell component comprises a substrate, a solar cell layer and a protective layer.

Preferably, the power-generating layer is a self-made product and comprises a substrate, a solar cell layer and a protective layer.

Preferably, the photovoltaic building material comprises an electrode.

Preferably, the substrate and solar cell layer are well-known in the art.

Preferably, the substrate comprises one of glass, metal plate, flexible plastic film and ceramic tile. The power-generating layer is deposited directly on the substrate layer.

Preferably, the thin film solar cell used in the power-generating layer comprises copper indium gallium selenide solar cell, gallium arsenide solar cell, amorphous silicon solar cell, cadmium telluride solar cell, dye-sensitized solar cell, copper zinc tin sulfur solar cell or perovskite solar cell.

Preferably, the protective layer of the photovoltaic building material comprises one or more of ceramic film, ethylene-vinyl acetate copolymer (EVA), polyvinyl butyral (PVB), polyethylene-butylene copolymer (POE), silica gel, polyethylene (PE), polyethylene-tetrafluoroethylene copolymer (ETFE), perfluoroethylene propylene copolymer (FEP), polyvinylidene fluoride film (PVDF), polyethylene terephthalate (PET), inorganic glass, organic glass (PMMA) and polycarbonate (PC).

When the protective layer only has a ceramic film, the ceramic film used in the protective layer comprises one or more of oxide, nitride and fluoride. The oxide comprises one or more of silicon oxide, zinc oxide and titanium oxide. The nitride comprises aluminum nitride and/or silicon nitride. The fluoride comprises polytetrafluoroethylene.

When the protective layer comprises one or more of glue film, i.e. EVA, PVB, POE and silica gel, the protective layer further comprises a front film.

The front film comprises glass and/or polymeric material.

Preferably, the polymeric material comprises one or more of PMMA, PC, ETFE, PVDF, FEP, PET and PET/PE.

Preferably, the ceramic film has a thickness of 0.4 μm to 1000 μm.

Preferably, the ceramic film can be prepared by a sputtering method or a chemical vapor deposition method.

Preferably, the combination of the surface layer, the power-generating layer and the first substrate can be adhered to the second substrate. The second substrate comprises one or more of glass, metal plate, cement-based plate, wood plate, bamboo plate, stone plate, concrete plate, plastic plate, ceramic tile and tile.

The present disclosure provides a process for preparing a photovoltaic building material, comprising:
  mixing a curing mother liquor, a light diffusing agent and a coloring agent in a proportion to prepare a mixing solution of a surface layer; and
  preparing a surface layer on a power-generating layer, wherein the surface layer is prepared by coating and curing the mixing solution of a surface layer directly on a surface of the power-generating layer.

Preferably, the surface layer may be prepared on a power-generating layer by manual spraying, automatic spraying, brushing, spin coating, pressing, printing, slurry, rolling brush, blade coating or coating.

Preferably, the curing temperature is −10° C. to 90° C. and the curing time is 0.2 s to 48 h.

The material of the surface layer in some processes needs to be performed under high temperature conditions, while high temperature causes damage to the photovoltaic components. The composition of the material of the surface layer is improved in the present disclosures, so that the material of the surface layer can be cured at −10° C. to 90° C. Moreover, the surface layer can have a high transmittance by controlling the thickness and the composition of the surface layer.

The whole process of the preparation method is carried out at a lower temperature without high-temperature treatment, which can effectively reduce the energy consumption and ensures the cell will not be damaged.

Compared with the prior art, the photovoltaic building material in the building field has the following advantages:

1) The surface layer is prepared on the surface of the solar cell in the present disclosure, so that the surface of the solar cell can exhibit the texture of a conventional building material and the conversion efficiency of the solar cell is almost not reduced while the power generation is ensured.

2) The curing temperature of the surface layer in the present disclosure is between −10° C. and 90° C., which does not cause damage to the photovoltaic component and can form a surface layer with high hardness on the photovoltaic component.

3) The surface layer prepared in the present disclosure not only can be firmly combined with the photovoltaic component, but has better wear resistance.

4) The surface layer prepared in the present disclosure has good weather resistance and can be used for decades in the building exterior wall.

5) The surface layer prepared in the present disclosure has strong compactness and corrosion resistance. Therefore, the solar cell in the surface layer can be effectively isolated from the outside.

6) The power-generating building material prepared in the present disclosure has stable performance, bright color, good decorative property and wide application prospects.

Furthermore, for various deficiencies of photovoltaic cells in the prior art, the object of the present disclosure also comprises the provision of a power-generating building material with the same texture and appearance as natural stone materials such as marble, granite and the like. The power-generating building material is no longer limited to the glass texture and the single color of the traditional photovoltaic component. By changing the composition, the preparation process and the thickness of the protective layer of the power-generating building material, it is possible to make the building material present various desired colorful appearances and rich textures. The power-generating building material can utilize solar power to generate electricity without destroying the appearance and style of the building and has a wide application prospect.

The specific technical solutions of the present disclosure are as follows.

A power-generating building material is a power-generating building material with a photovoltaic power-generating function, wherein the power-generating building material comprises a protective layer of a building material, a photoelectric conversion layer and a building material substrate layer; the protective layer of the building material has texture and quality of a building material, and the weighted average transmittance of the protective layer of the building material is 10% to 85% in a wavelength range of 300 nm to 1,300 nm.

Preferably, the raw material of the protective layer of the building material comprises a mother liquor and a filling pigment. The mother liquor comprises one or more of silicone emulsion, silicate aqueous solution, polyurethane emulsion, polyacrylic acid emulsion and high molecular polymer emulsion comprising carbon-fluorine bonds.

The filling pigment may use inorganic pigment and comprise one or more of carbonate, oxide, sulfide, selenide, sulfate, silicate, ferrocyanide, chromate, molybdate and a mixture of oxides.

The filling pigment may also use organic pigment and comprise one or more of phthalocyanine, azo and polycyclic.

Preferably, the raw materials of the protective layer of the building material may comprise a small amount of nanoparticles, quantum dots and graphene.

Further preferably, the nanoparticles comprise an inorganic light diffusing agent and/or an organic light diffusing agent.

Preferably, the raw materials of the protective layer of the building material comprise, in parts by weight, 143 to 296 parts of mother liquor and 1 to 10 parts of filling pigment.

Further preferably, the mother liquor comprises 30 to 90 parts of water glass, 90 to 160 parts of filler, 0.1 to 0.5 part of defoaming agent, 3 to 5 parts of thickening agent, 1 to 5 parts of a film forming auxiliary agent, 5 to 9 parts of curing agent and 14 to 27 parts of water. The curing mechanism of the liquid material of the mother liquor comprises absorbing carbon dioxide in the air to form amorphous silicates and gradually drying and curing.

Further preferably, the pigment comprises an inorganic pigment and an organic pigment. The inorganic pigment comprises a natural mineral pigment and/or an artificial pigment. The natural mineral pigment comprises mineral green, carbon black, mica, coral and realgar. The artificial pigment comprises iron oxide red, iron oxide yellow, titanium white, chrome yellow, iron blue, pearlescent silver and pearlescent gold. The organic pigment comprises one or more of azo pigment, phthalocyanine pigment, triarylmethane pigment and polycyclic pigment. The filler comprises one or more of white carbon black, kaolin, heavy calcium carbonate, light calcium carbonate, wollastonite powder, talcum powder, quartz powder, mica powder, aluminum silicate, barium sulfate and bentonite. The defoaming agent comprises one or more of lower alcohol, mineral oil and silicone resin. The thickening agent comprises one or more of silicone gel, methyl cellulose and hydroxypropyl methyl cellulose. The film forming auxiliary agent comprises dodecanol ester. The curing agent comprises vinyl triamine and m-phenylenediamine (m-PDA).

Preferably, it comprises, in parts by weight, 75 to 115 parts of mother liquor and 1 to 5 parts of pigment.

Further preferably, the mother liquor comprises, in parts by weight, a base material, a filler and an auxiliary agent. The mother liquor comprises, in parts by weight, 50 to 70 parts of base material, 5 to 15 parts of filler and 3 to 6 parts of auxiliary agent.

Further preferably, the base material comprises a fluorocarbon resin. The pigment comprises a natural mineral pigment and/or an artificial pigment. The natural mineral pigment comprises one or more of mineral green, carbon black, mica, coral, and realgar. The artificial pigment comprises one or more of iron oxide red, iron oxide yellow, titanium white, chrome yellow and iron blue. The filler comprises one or more of white carbon black, kaolin, calcium carbonate, wollastonite powder, talcum powder, quartz powder, mica powder, aluminum silicate, barium sulfate and bentonite. The auxiliary agent comprises a wetting agent, a dispersing agent, a defoaming agent, a film forming auxiliary agent, an anti-mildew agent and a thickening agent.

Further preferably, the wetting agent comprises glycerol and/or dimethyl sulfoxide. The dispersing agent comprises sodium polyacrylate salt and/or polyacrylic acid ammonium salt. The defoaming agent comprises one or more of emulsified silicone oil, polyoxyethylene polyoxypropylene pentaerythritol ether and polyoxyethylene polyoxypropylene ether. The film forming auxiliary agent comprises dodecyl alcohol. The anti-mildew agent comprises one or more of calcium propionate, ammonium persulfate and o-phenylphenol. The thickening agent comprises one or more of silicone gel, methyl cellulose and hydroxypropyl methyl cellulose.

Preferably, the raw materials for preparing the protective layer mainly comprise a mother liquor and are supplemented with pigment. The raw material comprises, in parts by weight: 140 to 200 parts of mother liquor and 1 to 10 parts of pigment.

Further preferably, the mother liquor comprises, in parts by weight, 600 to 800 parts of deionized water, 0.1 to 1 part of cross-linking agent, 2-5 parts of cellulose, 0.5 to 3 parts of dispersing agent, 0.5 to 3 parts of multifunctional auxiliary agent, 1 to 4 parts of bactericide, 15 to 30 parts of forming agent, 2 to 6 parts of ethylene glycol, 8 to 10 parts of film forming auxiliary agent, 15 to 28 parts of soap-free polymerized silicone acrylic emulsion and 50 to 110 parts of silicone grafted acrylate emulsion.

Further preferably, the pigment comprises 5 to 14 parts of inorganic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow and iron blue.

Further preferably, the pigment may be an organic pigment. The pigment comprises 5 to 15 parts of organic pigment. The organic pigment comprises one or more of azo pigment, phthalocyanine pigment, triarylmethane pigment and polycyclic pigment.

Further preferably, the material of the protective layer further comprises a sandstone powder. The sandstone powder comprises one or more of quartz sand, kaolin, marble powder and white jade powder.

Preferably, the pigment comprises a thermochromic pigment and/or a photochromic pigment.

Preferably, the protective layer of the building material has a thickness of 0.01 mm to 5 mm.

Preferably, the protective layer of the building material has a weighted average transmittance of 10% to 85% in a wavelength range of 300 nm to 1,300 nm by controlling the thickness, composition and preparation process of the protective layer of the building material.

Preferably, the protective layer of the building material has the water absorption rate of less than or equal to 8%, has no damage after 50 freeze-thaw cycles, does not cause cracking and cracks, has the artificial weathering aging resistance of greater than or equal to 600 h, has the stain resistance of less than or equal to 20%, meets the requirements of the chemical corrosion resistance and has the scrub resistance of more than or equal to 1000 times. The adhesion force between the protective layer of the building material and the power-generating layer is greater than or equal to 1 MP. The Mohs hardness of the protective layer of the building material is greater than or equal to 3. The surface layer meets the performance requirements in the building field.

Preferably, the substrate layer of the power-generating building material is a common building material. The water absorption rate of the common building material is below 0.5% and comprises one of glass, metal plate, cement-based fiber board, flexible plastic film and ceramic tile. The photoelectric conversion layer is directly deposited on the substrate layer of the building material.

Preferably, the photoelectric conversion layer comprises a thin film solar cell and a barrier layer.

Preferably, the thin film solar cell used in the photoelectric conversion layer comprises one or more of copper indium gallium selenide solar cell, gallium arsenide solar cell, amorphous silicon solar cell, cadmium telluride solar cell, dye-sensitized solar cell, copper zinc tin sulfur solar cell and perovskite solar cell.

Preferably, the barrier layer of the photoelectric conversion layer of the power-generating building material comprises ceramic film, ethylene-vinyl acetate copolymer (EVA), polyvinyl butyral (PVB), polyethylene-butylene copolymer (POE), silica gel, polyethylene (PE), polyethylene-tetrafluoroethylene copolymer (ETFE), perfluoroethylene propylene copolymer (FEP), polyvinylidene fluoride (PVDF), polyethylene terephthalate (PET), glass, organic glass (PMMA) and polycarbonate (PC).

When the barrier layer only has a ceramic film, the ceramic film comprises oxide and/or nitride. The oxide comprises one or more of silicon oxide, zinc oxide, and titanium oxide. The nitride comprises aluminum nitride and/or silicon nitride.

When the barrier layer comprises EVA, PVB, POE or silica gel, the barrier layer further comprises a front film. The front film comprises glass and polymeric material.

Preferably, the polymeric material comprises one or more of PMMA, PC, ETFE, PVDF, FEP, PET and PET/PE.

Preferably, the ceramic film has a thickness of 0.4 μm to 100 μm.

Preferably, the ceramic film can be prepared by one of a sputtering method and a chemical vapor deposition method.

Preferably, the power-generating building material comprises at least one pair of positive and negative electrodes. The electrode is disposed on the substrate layer or on a side edge of the power-generating building material.

Preferably, the power-generating building material can be used for the exterior surface of the building. The thickness of the power-generating building material is 5 mm to 30 mm.

The photoelectric conversion efficiency of the power-generating building material does not change after the power-generating building material is subject to 200 thermal cycles in the thermal cycling test. The photoelectric conversion efficiency of the power-generating building material does not change after the power-generating building material is subject to 10 cycles in the humidity-freeze test. The photoelectric conversion efficiency of the power-generating building material does not change after the power-generating building material is subject to 1000 h in the wet heat test. In the dielectric withstand voltage test of the power-generating building material, the leakage current is less than 50 μA and the insulation resistance is greater than 50 MΩ.

The present disclosure also provides a process for preparing any power-generating building material, comprising:
  washing a building material substrate layer, sequentially preparing each film layer required to form a solar cell on the washed building material substrate layer, and extracting positive and negative electrodes;
  preparing a barrier layer on the solar cell to form a photoelectric conversion layer together with the solar cell; and
  preparing a protection layer of a building material on a light receiving surface of the photoelectric conversion layer, wherein the protective layer of the building material is prepared with coating and curing a liquid raw material on the light receiving surface of the photoelectric conversion layer.

Preferably, the standard washing process is as follows:
Loading→lotion roller brushing and washing→pure water roller brushing and washing→ultrasonic treatment→BJ spraying→pure water spraying→pure water rinsing→air knife drying→Laying off.

The process parameters of each module of the washing machine are as follows:

(1) Roller brushing section: The roller brushing speed is 400 r/min. The upper and lower spraying water pressure is controlled between 1.0 MPa and 1.3 MPa. The ratio by volume of cleaning agent to deionized water is 1:9. (2) Washing section: The roller brushing speed is 300 r/min. The upper and lower spraying water pressure is controlled between 0.5 MPa and 1.0 MPa. (3) Ultrasonic section: The ultrasonic frequency is fixed at 18 kHz. The substrate glass must be immersed in the water of ultrasonic section. (4) BJ spraying section: BJ nozzle must form an angle of 30° with the transmission direction. Water pressure should be controlled at 0.4 MPa. The air pressure must be greater than 0.6 MPa. (5) Pure water spraying section: The upper and lower spray pressure is controlled between 0.4 MPa and 0.8 MPa. (6) Pure water washing section: The upper and lower spray pressure is controlled between 0.2 MPa and 0.4 MPa. (7) Air knife section: The pressure of the air knife should be higher than 0.6 MPa. (8) Destaticization: Static electricity must be removed after the substrate is dried.

Preferably, the protective layer of the building material can be prepared on the power-generating layer with a liquid material by hand spraying, automatic spraying, brushing, spin coating, pressing, printing, slurry, rolling brush, blade coating or coating.

Preferably, the curing temperature is −10° C. to 100° C. and the curing time is 0.1 s to 72 h.

Compared with the prior art, the power-generating building material has the following advantages:

1) The power-generating building material in the present disclosure has not only the function of utilizing sunlight power-generating, but the texture and quality of building materials. The power-generating building material completely overcomes the defects of light pollution such as flash, dizziness and the like caused by specular reflection of conventional photovoltaic component.

2) The color and the pattern of the protective layer of the building material in the present disclosure can be designed according to requirements. The power-generating building material has a rich and colorful appearance. High fusion of modern urban building art is achieved. The power-generating building material has a wide application prospect.

3) Due to the fact that the curing temperature of the protective layer of the building material in the present disclosure is low, damage to the solar cell component is avoided, the preparation process is simple, the energy consumption is low, pollution is avoided, and the cost of the product is low.

4) The protective layer of the building material prepared in the present disclosure has stronger adhesive force with the photoelectric conversion layer, good wear resistance and strong corrosion resistance, meets the weather resistance requirement of the building materials of exterior walls of the common buildings, and has longer service life than the service life of the current common photovoltaic component.

Furthermore, the present disclosure further provides another power-generating building material, comprising at least a protective layer of a building material, a photoelectric conversion layer, a functional layer and a building material substrate layer; wherein the photoelectric conversion layer has a power-generating function;

the protective layer of the building material is arranged on a first surface of the photoelectric conversion layer, and the protective layer of the building material is obtained by liquid curing;

the functional layer is arranged on a second surface of the photoelectric conversion layer;

the building material substrate layer is arranged on a fourth surface of the functional layer away from the photoelectric conversion layer; and the photoelectric conversion layer and the building material substrate layer are bonded through the functional layer.

Preferably, the raw material of the protective layer of the building material comprises a mother liquor and a filling pigment.

The mother liquor comprises one or more of silicone emulsion, silicate aqueous solution, polyurethane emulsion, polyacrylic acid emulsion and polymer emulsion comprising carbon-fluorine bonds.

The filling pigment uses an inorganic pigment and comprises one or more of carbonate, oxide, sulfide, selenide, sulfate, silicate, ferrocyanide, chromate, molybdate and a mixture of oxides.

The filling pigment uses an organic pigment and comprises one or more of phthalocyanine, azo and polycyclic.

Preferably, the raw materials of the protective layer of the building material may comprise a small amount of nanoparticles, quantum dots and graphene. The nanoparticles comprise an inorganic light diffusing agent and/or an organic light diffusing agent.

Preferably, the raw materials of the protective layer of the building material comprise, in parts by weight, 75 to 115 parts of the mother liquor and 1 to 5 parts of the pigment.

Further preferably, the mother liquor comprises a base material, a filler and an auxiliary agent. The mother liquor comprises, in parts by weight, 50 to 70 parts of base material, 5 to 15 parts of filler and 3 to 6 parts of auxiliary agent.

Further preferably, the base material comprises fluorocarbon resin. The pigment comprises a natural mineral pigment and/or an artificial pigment. The natural mineral pigment comprises one or more of mineral green, carbon black, mica, coral, and realgar. The artificial pigment comprises one or more of iron oxide red, iron oxide yellow, titanium white, chrome yellow and iron blue. The filler comprises one or more of white carbon black, kaolin, calcium carbonate, wollastonite powder, talcum powder, quartz powder, mica powder, aluminum silicate, precipitated barium sulfate and bentonite. The auxiliary agent comprises one or more of a wetting agent, a dispersing agent, a defoaming agent, a film forming auxiliary agent, an anti-mildew agent and a thickening agent.

Further preferably, the wetting agent comprises glycerol and/or dimethyl sulfoxide. The dispersing agent comprises sodium polyacrylate salt and/or polyacrylic acid ammonium salt. The defoaming agent comprises one or more of emulsified silicone oil, polyoxyethylene polyoxypropylene pentaerythritol ether and polyoxyethylene polyoxypropylene ether. The film forming auxiliary agent comprises dodecyl alcohol. The anti-mildew agent comprises one or more of calcium propionate, ammonium persulfate and/or o-phenylphenol. The thickening agent is one or more of silicone gel, methyl cellulose and hydroxypropyl methyl cellulose.

Preferably, the raw materials for preparing the protective layer of the building material mainly comprise mother liquor and are supplemented with pigment. The raw materials comprise, in parts by weight, 140 to 200 parts of mother liquor and 1 to 10 parts of pigment.

Further preferably, the mother liquor comprises, in parts by weight, 600 to 800 parts of deionized water, 0.1 to 1 part of cross-linking agent, 2 to 5 parts of cellulose, 0.5 to 3 parts of dispersing agent, 0.5 to 3 parts of multifunctional auxiliary agent, 1 to 4 parts of bactericide, 15 to 30 parts of forming agent, 2 to 6 parts of ethylene glycol, 8 to 10 parts of film forming auxiliary agent, 15 to 28 parts of soap-free polymerized silicone acrylic emulsion and 50 to 110 parts of silicone grafted acrylate emulsion.

Further preferably, the pigment comprises 5 to 15 parts of inorganic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow and iron blue.

Further preferably, the pigment may be an organic pigment. The organic pigment comprises one or more of azo pigment, phthalocyanine pigment, triarylmethane pigment and polycyclic pigment.

Further preferably, the raw material of the protective layer of the building material further comprises sandstone powder. The sandstone powder comprises one or more of quartz sand, kaolin, marble powder and white jade powder.

Preferably, the mother liquor is 143 to 296 parts by weight and the pigment is 1 to 10 parts by weight.

Further preferably, the mother liquor comprises 30 to 90 parts of water glass, 90 to 160 parts of filler, 0.1 to 0.5 part of a defoaming agent, 3 to 5 parts of thickening agent, 1 to 5 parts of film forming auxiliary agent, 5 to 9 parts of curing agent and 14 to 27 parts of water. The curing mechanism of the liquid material of the mother liquor comprises absorbing carbon dioxide in the air to form amorphous silicates and gradually drying and curing.

Further preferably, the pigment comprises an inorganic pigment and/or an organic pigment. The inorganic pigment comprises a natural mineral pigment and/or an artificial pigment. The natural mineral pigment comprises one or more of mineral green, carbon black, mica, coral and realgar. The artificial pigment comprises one or more of iron oxide red, iron oxide yellow, titanium white, chrome yellow, iron blue, pearlescent silver and pearlescent gold. The organic pigment comprises one or more of azo pigment, phthalocyanine pigment, triarylmethane pigment and polycyclic pigment. The water glass comprises sodium silicate glass and/or potassium water glass. The filler comprises one or more of white carbon black, kaolin, heavy calcium carbonate, light calcium carbonate, wollastonite powder, talcum powder, quartz powder, mica powder, aluminum silicate, precipitated barium sulfate and bentonite. The defoaming agent comprises one or more of lower alcohols, mineral oil and silicone resin. The thickening agent comprises one or more of silicone gel, methyl cellulose and hydroxypropyl methyl cellulose. The film forming auxiliary agent comprises dodecyl alcohol ester. The curing agent comprises vinyl triamine and/or m-phenylenediamine (m-PDA).

Preferably, the pigment comprises a thermochromic pigment and/or a photochromic pigment.

Preferably, the protective layer of the building material has a weighted average transmittance of 10% to 85% in a wavelength range of 300 nm to 1,300 nm by controlling the thickness, composition and preparation process of the protective layer of the building material.

Preferably, the protective layer of the building material has a thickness of 0.01 mm to 5 mm.

Preferably, the protective layer of the building material has the water absorption rate of less than or equal to 8%, has no damage after 50 freeze-thaw cycles, does not cause cracking and cracks, has the artificial weathering aging resistance of greater than or equal to 600 h, has the stain resistance of less than or equal to 20%, meets the requirements of the chemical corrosion resistance and has the scrub resistance of more than or equal to 1000 times. The adhesion force between the protective layer of the building material and the power-generating layer is greater than or equal to 1 MP. The Mohs hardness of the protective layer of the building material is greater than or equal to 3. The surface layer meets the performance requirements in the building field.

Preferably, the photoelectric conversion layer comprises a thin film solar cell component and/or a crystalline silicon solar cell component.

Preferably, the photoelectric conversion layer comprises one or more in series of a thin-film solar cell chip with a barrier layer, one or more in series of a crystalline silicon solar cell chip with a barrier layer, and several chips in hybrid series of a thin-film solar cell chip with a barrier layer and a crystalline silicon solar cell chip with a barrier layer.

Further preferably, the thin film solar cell in the photoelectric conversion layer comprises copper indium gallium selenide solar cell, gallium arsenide solar cell, amorphous silicon solar cell, cadmium telluride solar cell, dye-sensitized solar cell, copper zinc tin sulfur solar cell or perovskite solar cell.

Preferably, the functional layer comprises one of a non-acidic colloid and a hot melt colloid.

Further preferably, the functional layer may be polyvinyl butyral (PVB) or ethylene-vinyl acetate copolymer (EVA).

Preferably, the building material substrate layer is a common building material and comprises one or more of glass, metal plate, cement-based plate, flexible plastic film, ceramic tile and tile.

Preferably, the power-generating building material comprises at least one pair of positive and negative electrodes.

Preferably, the protective layer of the building material is obtained by liquid curing.

A process for generating a building material, comprising:
arranging a functional layer on a substrate layer of a building material; attaching a second surface of a photoelectric conversion layer to the functional layer;
bonding the building material substrate layer with the photoelectric conversion layer through the functional layer; and
coating and curing a raw material mixing liquid of a protective layer of a building material on a first surface of the photoelectric conversion layer to obtain the protective layer of the building material.

Preferably, the protective layer of the building material is prepared on a first surface of the photoelectric conversion layer with a liquid material by manual spraying, automatic spraying, brushing, spin coating, pressing, printing, slurry, rolling brush, blade coating or coating.

Preferably, the curing temperature of the protective layer of the building material is −10° C. to 100° C. and the curing time is 0.1 s to 72 h. Moreover, the protective layer of the building material can have a high transmittance by controlling the thickness and composition of the protective layer of the building material.

Compared with the prior art, the power-generating building material has the following advantages:
1) The power-generating building material in the present disclosure has not only the function of utilizing sunlight power-generating, but completely overcomes the defects of light pollution such as flash, dizziness and the like caused by specular reflection of conventional photovoltaic component.
2) The color and the pattern of the protective layer of the building material in the present disclosure can be designed according to requirements. The power-generating building material has a rich and colorful appearance. High fusion of modern urban building art is achieved. The power-generating building material has a wide application prospect.

3) The curing temperature of the protective layer of the building material in the present disclosure is −10° C. to 100° C. Due to the fact that the curing temperature is low, damage to the solar cell component is avoided, the preparation process is simple, the energy consumption is low, pollution is avoided, and the cost of the product is low.

4) The protective layer of the building material prepared in the present disclosure has stronger adhesive force with the photoelectric conversion layer, good wear resistance and strong corrosion resistance, meets the weather resistance requirement of the building materials of exterior walls of the common buildings, and has longer service life than the service life of the current common photovoltaic component.

Furthermore, the present disclosure provides a power-generating building material, comprising a surface layer, a photoelectric conversion device, a substrate layer and an electrode; wherein
the photoelectric conversion device has a first surface and a second surface; the first surface is a light receiving surface; and the photoelectric conversion device is electrically connected with the electrode;
the substrate layer is an engineering structural panel, and the substrate layer is attached to the second surface of the photoelectric conversion device;
the surface layer is attached to the first surface of the photoelectric conversion device away from the substrate layer; the surface layer is an optical adjustment material, the optical adjustment material is a translucent layer with texture and quality of a building material, and the translucent layer has a weighted average transmittance of 10% to 85% in a wavelength range of 300 nm to 1,300 nm; and
the electrode is arranged at bottom and/or side edge of the power-generating building material.

Preferably, the surface layer consists of an optical medium material with an atomization scattering effect and a texture phase; micro-particles with optical adjustment function are distributed in the optical medium material, which forms a haze, and a size of the micro-particles with optical adjustment function is 0.1 μm to 2 μm; and the texture phase comprises one or more of oxide, carbonate, sulfide, phthalocyanine, azo and polycyclic.

The raw materials for preparing the surface layer comprises a base material, a solvent, an auxiliary agent and a filler. The filler comprises a nanoparticle, a microparticle and a pigment. The raw material of the surface layer is firstly mixed to form a liquid raw material according to a ratio and a process flow, then coated, and finally cured at a temperature to form a surface layer with an optical adjustment function. Part of nanoparticles and micron particles are dispersed in the surface layer so that the light penetrating the surface layer is atomized and scattered to form a haze. As part of nanoparticles in the surface layer have photoluminescence and absorb light in ultraviolet range penetrating the surface layer, the visible light is excited. Meanwhile, the pigment particles distributed in the surface layer can reflect light in a certain waveband penetrating the surface layer. The excitation light and the reflected light jointly act in the medium material to form colors and patterns, so that the surface layer exhibits texture and quality of the building material. Moreover, a large number of EVA glue films used in the photovoltaic field tend to generate yellowing and aging due to the absorption of ultraviolet band photons in the solar spectrum. In the present disclosure, the ultraviolet band photons are absorbed by the surface layer, which prolongs the service life of the glue film and therefore prolongs the service life of the power-generating building material.

On one hand, the photoluminescent nanoparticles distributed in the surface layer can absorb the ultraviolet band light penetrating the surface layer, which reduces the irradiation of the polymer in the photoelectric conversion device and prolongs the service life of the photoelectric conversion device. On the other hand, the photoluminescent nanoparticles can absorb the light in ultraviolet band which cannot be absorbed by the photoelectric conversion device, convert the ultraviolet waveband light rays into visible light waveband light rays capable of being absorbed by the photoelectric conversion device, and improve the power-generating efficiency of the photoelectric conversion device.

Preferably, the photoluminescent nanoparticle comprises one or more of InP/ZnS, CdSe/ZnS and PbS.

Preferably, the raw material of the surface layer comprises, in parts by weight, 600 to 800 parts of deionized water, 0.1 to 1 part of cross-linking agent, 2 to 5 parts of cellulose, 0.5 to 3 parts of dispersing agent, 0.5 to 3 parts of multifunctional auxiliary agent, 1 to 4 parts of bactericide, 15 to 30 parts of forming agent, 2 to 6 parts of ethylene glycol, 8 to 10 parts of film forming auxiliary agent, 15 to 28 parts of soap-free polymerized silicone acrylic emulsion and 50 to 110 parts of silicone grafted acrylate emulsion. The nanoparticles and the micron particles as the light diffusing agent are 0.1-10 parts and comprise one or more of nano barium sulfate, nano calcium carbonate, nano silicon dioxide, acrylic acid type, styrene type and acrylic resin. The pigment of the surface layer is 5-15 parts. The pigment is one or more of mineral green, carbon black, mica, coral, realgar, iron oxide red, iron oxide yellow, titanium white, chrome yellow and iron blue.

Further preferably, the pigment may be an organic pigment and comprise one or more of azo phthalocyanine, benzimidazolone, pyrazolone, quinacridone, isoindoline, anthrapyrimidine and acetoacetamide.

Preferably, the surface layer comprises, in parts by weight, 30 to 90 parts of water glass, 90 to 160 parts of filler, 3 to 5 parts of thickening agent, 5 to 9 parts of curing agent, 14 to 27 parts of water, 1 to 10 parts of pigment and 0.1 to 5 parts of nanoparticles and/or microparticles as a light diffusing agent. The water glass comprises sodium silicate glass and/or potassium water glass. The filler comprises one or more of white carbon black, kaolin, heavy calcium carbonate, light calcium carbonate, wollastonite powder, talcum powder, quartz powder, mica powder, aluminum silicate, precipitated barium sulfate and bentonite. The thickening agent comprises one or more of silicone gel, methyl cellulose and hydroxypropyl methyl cellulose. The curing agent comprises vinyl triamine and/or m-phenylenediamine m-PDA. The nanoparticles and microparticles comprise one or more of nano barium sulfate, nano calcium carbonate, nano silicon dioxide, acrylic acid type, styrene type and acrylic resin. The pigment comprises one or more of mineral green, carbon black, iron oxide red, iron oxide yellow, chrome yellow, iron blue, pearl silver, pearlescent gold, phthalocyanine, benzimidazolone, pirone, quinacridone, isoindoline, anthrapyrimidine and acetoacetamide.

Preferably, the raw material of the surface layer comprises a base material, a filler, an auxiliary agent and the like and specifically comprises, in parts by weight, 50 to 70 parts of base material, 5 to 15 parts of filler, 3 to 6 parts of auxiliary agent, 1 to 5 parts of pigment and 1 to 6 parts of nanoparticles and micro-particles as a light diffusing agent. The base material comprises fluorocarbon resin. The filler comprises one or more of white carbon black, kaolin, calcium carbonate, wollastonite powder, talcum powder, quartz powder, mica powder, aluminum silicate, precipitated barium sulfate and bentonite. The auxiliary agent comprises one or more of a wetting agent, a dispersing agent, a defoaming agent, a film forming auxiliary agent, an anti-mildew agent and a thickening agent. Furthermore, the wetting agent comprises glycerol and/or dimethyl sulfoxide. The dispersing agent comprises sodium polyacrylate salt and/or polyacrylic acid ammonium salt. The defoaming agent comprises one or more of emulsified silicone oil, polyoxyethylene polyoxypropylene pentaerythritol ether and polyoxyethylene polyoxypropylene amine ether. The film forming auxiliary agent comprises dodecyl alcohol. The anti-mildew agent comprises one or more of calcium propionate, ammonium persulfate and o-phenylphenol. The thickening agent is one or more of silicone gel, methyl cellulose and hydroxypropyl methyl cellulose. The pigment comprises one or more of mineral green, carbon black, mica, coral, realgar, iron oxide red, iron oxide yellow, titanium white, chrome yellow and iron blue. The nanoparticles and/or microparticles comprise one or more of nano barium sulfate, nano calcium carbonate, nano silicon dioxide, acrylic acid type, styrene type and acrylic resin.

The photoelectric conversion device sequentially comprises a photogenerated hole collection back electrode, a photogenerated carrier layer, a photogenerated electron collection front electrode and a barrier layer, wherein the back electrode and the front electrode have a current collecting device, and the current collecting device is electrically connected with the electrode.

Preferably, the photoelectric conversion device may be a solar cell component or a solar cell chip. The solar cell component comprises a crystalline silicon solar cell component, a thin film solar cell component or a combination thereof. The solar cell chip comprises a crystalline silicon solar cell chip, a thin film solar cell chip or a combination thereof. The crystalline silicon solar cell comprises a monocrystalline silicon solar cell and a polycrystalline silicon solar cell. The thin film solar cell comprises copper indium gallium selenide solar cell, gallium arsenide solar cell, amorphous silicon solar cell, cadmium telluride solar cell, dye-sensitized solar cell, copper zinc tin sulfur solar cell and perovskite solar cell. When a solar cell chip is used as a photoelectric conversion device, a barrier layer needs to be prepared on the surface of the solar cell chip. The surface layer can only be prepared on the barrier layer by liquid curing, so that good performance of the photoelectric conversion device can be ensured.

The barrier layer comprises one or more of ceramic film, ethylene-vinyl acetate copolymer (EVA), polyvinyl butyral (PVB), polyethylene-butylene copolymer (POE), silica gel, polyethylene (PE), polyethylene-tetrafluoroethylene copolymer (ETFE), perfluoroethylene propylene copolymer (FEP), polyvinylidene fluoride (PVDF), polyethylene terephthalate (PET), glass, organic glass (PMMA) and polycarbonate (PC).

Preferably, when the barrier layer only has a ceramic film, the barrier layer uses a ceramic film and comprises one or more of oxide and nitride. The oxide comprises one or more of silicon oxide, zinc oxide and titanium oxide. The nitride comprises aluminum nitride and/or silicon nitride.

Preferably, when the barrier layer comprises EVA, PVB, POE or silica gel, the barrier layer further comprises a front film; wherein the front film comprises glass and/or polymeric material. The polymeric material comprises one or more of PMMA, PC, ETFE, PVDF, FEP, PET and PET/PE.

Preferably, the ceramic film has a thickness of 0.4 μm to 100 μm.

Preferably, the ceramic film can be prepared by a sputtering method or a chemical vapor deposition method.

Preferably, the electrode comprises at least one pair of electrodes and one bypass diode. The bypass diode is connected in parallel with the photoelectric conversion device to form a bypass and is electrically connected with the positive and negative electrodes. When the photoelectric conversion device works normally, the bypass diode is in an off state and the current of the photoelectric conversion device is normally output. When the photoelectric conversion device cannot work normally, the bypass diode is communicated, and the system current bypasses the photoelectric conversion device which cannot work normally via the bypass diode, thereby ensuring the normal operation of the power-generating system of the building material. The electrodes are connected with the circuit system by socket, plug, and/or junction box.

The substrate layer is an engineering structure board, and the water absorption rate of the engineering structure board is less than 0.5% and comprises one or more of glass, a metal plate, a cement-based fiber board, a flexible plastic film and a ceramic tile. The material can be made into a board as a substrate layer of a power-generating building material in a laminated manner, and the board can be made into a board as a substrate layer of a power-generating building material in a splicing manner, and can be used as a substrate layer of a power-generating building material in addition to other boards made in any manner.

The substrate layer can be directly prepared into a photoelectric conversion device on the surface of the substrate layer, and a prepared photoelectric conversion device can be selected firstly, and the photoelectric conversion device is attached to the substrate layer through a subsequent process A process for preparing a power-generating building material, comprising:
   cleaning and drying the substrate layer according to a standard cleaning process, preparing a photoelectric conversion device on the substrate, or attaching the prepared photoelectric conversion device to the cleaned substrate layer, and extracting the positive and negative electrodes;
   mixing and stirring the weighed raw materials according to a certain program to form a liquid mixture;
   coating the liquid mixture on a first surface of a photoelectric conversion device in a mechanical or manual method; and
   standing the liquid surface layer at a certain temperature for a period of time, and completely curing the surface layer to obtain the power-generating building material of the present disclosure.

Preferably, the surface layer can be prepared on a photoelectric conversion device with a liquid material by manual spraying, automatic spraying, brushing, spin coating, pressing, printing, slurry, rolling brush, blade coating or coating.

Preferably, the curing temperature is −10° C. to 100° C. and the curing time is 0.1 s to 72 h.

The photoelectric conversion efficiency of the power-generating building material in the present disclosure does not change after the power-generating building material is subject to 200 thermal cycles in the thermal cycling test. The photoelectric conversion efficiency of the power-generating building material in the present disclosure does not change after the power-generating building material is subject to 10 cycles in the humidity-freeze test. The photoelectric conversion efficiency of the power-generating building material in the present disclosure does not change after the power-generating building material is subject to 1000 h in the wet heat test (85° C./85% RH). In the dielectric withstand voltage test of the power-generating building material, the leakage current is less than 50 μA and the insulation resistance is greater than 50 MΩ.

The protective layer of the building material has the water absorption rate of less than or equal to 8%, has no damage after 50 freeze-thaw cycles, does not cause cracking and cracks, has the artificial weathering aging resistance of greater than or equal to 600 h, has the stain resistance of less than or equal to 20%, meets the requirements of the chemical corrosion resistance and has the scrub resistance of more than or equal to 1000 times. The adhesion force between the protective layer of the building material and the power-generating layer is greater than or equal to 1 MP. The Mohs hardness of the protective layer of the building material is greater than or equal to 3. The surface layer meets the performance requirements in the building field.

Compared with the prior art, the power-generating building material has the following advantages:

1) The power-generating building material in the present disclosure not only has the function of utilizing sunlight power-generating, but uses an optical adjustment material as a surface layer. The power-generating building material completely overcomes the defects of light pollution such as flash, dizziness and the like caused by specular reflection of conventional photovoltaic component.

2) The color and the pattern of the protective layer of the building material in the present disclosure can be designed according to requirements. The power-generating building material has a rich and colorful appearance. High fusion of modern urban building art is achieved. The power-generating building material has a wide application prospect.

3) The curing temperature of the protective layer of the building material in the present disclosure is −10° C. to 100° C. Due to the fact that the curing temperature is low, damage to the solar cell component is avoided, the preparation process is simple, the energy consumption is low, pollution is avoided, and the cost of the product is low.

4) The protective layer of the building material prepared in the present disclosure has stronger adhesive force with the photoelectric conversion device, good wear resistance and strong corrosion resistance, meets the weather resistance requirement of the building materials of exterior walls of the common buildings, and has longer service life than the service life of the current common photovoltaic component.

DETAILED DESCRIPTION

The present disclosure will be further described in combination with the following examples.

Example 1

The optical adjustment layer was a layer of a light-transmitting ceramic with a thickness of 20 mm. The percentage of water vapor permeation was 0.5% and the hardness was 6H. The light-transmitting ceramic product was subject to optical grinding and polishing treatment and hydrophobic treatment, so that the optical adjustment layer with good light transmission performance and appreciated appearance was formed.

A copper indium gallium selenide solar cell was selected as the power-generating layer. A cement substrate material was selected as the substrate.

Figure 1:
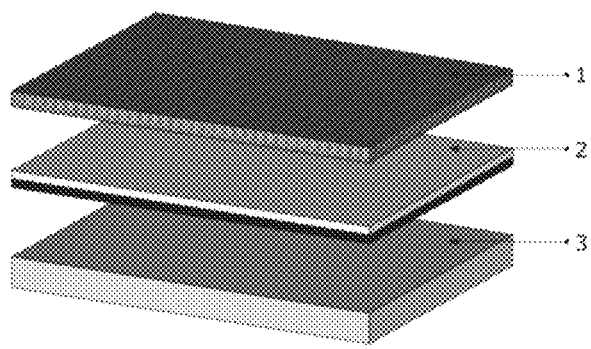
FIG. 1 is a structural diagram of a photovoltaic building material of the present disclosure, in which 1 is a surface layer; 2 is a power-generating layer; and 3 is a substrate layer.
Figure 2:
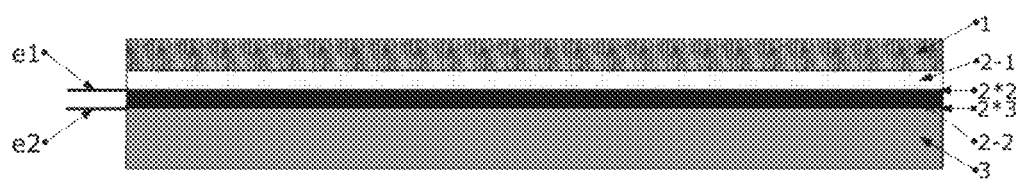
FIG. 2 is a side view of the structural diagram of the photovoltaic building material shown in FIG. 1, in which 1 is a surface layer; 3 is a substrate layer; 2-1 is a glue film; 2-2 is a solar cell layer; 2*2 is a negative electrode surface; 2*3 is a positive electrode surface; e1 is an extracted negative electrode; and e2 is an extracted positive electrode.

The surface of the power-generating layer was covered with the prepared light-transmitting ceramic optical adjustment layer. The power-generating layer and the optical adjustment layer were adhered by EVA and were insulated from each other. The solar cell was isolated from the water vapor. A power-generating panel with light-transmitting ceramic was prepared. The structural diagram was shown in FIGS. 1 and 2. The conversion efficiency of the power-generating panel after the light-transmitting ceramic optical adjustment layer was prepared on the surface of the cell was 12.0%.

Example 2

The optical adjustment layer was a layer of a light-transmitting ceramic with a thickness of 5 mm. The percentage of water vapor permeation was 0.1% and the hardness was 9H. The light-transmitting ceramic product was subject to optical grinding and polishing treatment and hydrophobic treatment, so that the transparent ceramic optical adjustment layer with good light transmission performance and appreciated appearance was formed.

A copper indium gallium selenide solar cell was selected as the power-generating layer. A building glass was selected as the substrate.

The surface of the power-generating layer was covered on the prepared light-transmitting ceramic optical adjustment layer. The power-generating layer and the light-transmitting ceramic optical adjustment layer were adhered by the EVA and were insulated from each other. The solar cell was isolated from the water vapor. A power-generating panel with light-transmitting ceramic was prepared. The cell efficiency after the light-transmitting ceramic optical adjustment layer was prepared on the surface of the cell was 8.9%.

Example 3

The optical adjustment layer was a layer of ultra-thin stone with a thickness of 0.1 mm. The percentage of water vapor permeation was 0.5% and the hardness was 7H. The preparation process was as follows:

The type of stone material was sedimentary rock. The surface of the stone material was polished and cleaned.

The curing adhesive was silicone and epoxy resin.

The silicone was coated on the polished surface of the stone material, and the surface of the stone material was covered with a layer of glass fiber cloth. The glue was cured by standing at 100° C. for 20 min. The surface of the glass fiber cloth was then coated with the epoxy resin and the surface of the epoxy resin was covered with a layer of glass fiber cloth. The glue was cured by standing at room temperature for 20 min.

The glass fiber cloth was torn off from the stone substrate by mechanical means to obtain the glass fiber cloth with the stone on the surface. The surface of the torn stone away from the glass fiber cloth was polished.

The glass fiber cloth and the torn stone were separated by acetone solution.

Hydrophobic treatment was performed on the ultra-thin stone product, so that the ultra-thin stone optical adjustment layer with good light transmission performance and appreciated appearance was formed.

The ultra-thin stone (optical adjustment layer) prepared in accordance with the present disclosure had strong corrosion resistance and higher hardness and no harm to human bodies. The ultra-thin stone had beautiful appearance of sedimentary rock and good decorative property.

A cadmium telluride solar cell was selected as the power-generating layer. A concrete was selected as the substrate.

The surface of the power-generating layer was covered with the prepared optical adjustment layer. The power-generating layer and the optical adjustment layer were adhered by EVA and were insulated from each other. The solar cell was isolated from the water vapor. A power-generating panel with ultra-thin stone optical adjustment layer was prepared. The efficiency of the cell after the optical adjustment layer was prepared on the surface of the cell was 11.5%.

Example 4

The optical adjustment layer was a layer of ultra-thin stone with a thickness of 0.2 mm. The percentage of water vapor permeation was 0.3% and the hardness was 6H. The preparation process was as follows:

The type of stone material was shale. The surface of the stone material was polished and cleaned.

The curing adhesive was epoxy resin.

The epoxy resin was coated on the polished surface of the stone material, and the surface of the stone material was covered with a layer of transparent glass fiber cloth. The glue was cured by standing at 25° C. for 30 min. The surface of the glass fiber cloth was then coated with the epoxy resin and the surface of the epoxy resin was covered with a layer of glass fiber cloth. The glue was cured by standing at 25° C. for 30 min.

The glass fiber cloth was torn off from the stone substrate by mechanical means to obtain the glass fiber cloth with the stone on the surface. The surface of the torn stone away from the glass fiber cloth was polished.

The glass fiber cloth and the torn stone were separated by acetone solution.

Hydrophobic treatment was performed on the ultra-thin stone product, so that the ultra-thin stone optical adjustment layer with good light transmission performance and appreciated appearance was formed.

The ultra-thin stone prepared in accordance with the present disclosure had strong corrosion resistance and higher hardness and no harm to human bodies. The ultra-thin stone had beautiful appearance of shale and good decorative property.

An amorphous silicon solar cell was selected as the power-generating layer. A metal plate was selected as the substrate.

The surface of the power-generating layer was covered with the prepared optical adjustment layer. The power-generating layer and the optical adjustment layer were adhered by EVA and were insulated from each other. The solar cell was isolated from the water vapor. A power-generating panel with ultra-thin stone optical adjustment layer was prepared. The efficiency of the cell after the optical adjustment layer was prepared on the surface of the cell was 9.5%.

Example 5

The optical adjustment layer was an artificial light-transmitting resin sheet with a thickness of 0.1 mm. The percentage of water vapor permeation was 0.5% and the hardness was 6H. The preparation process comprised: powder preparation, molding, curing and surface processing.

Powder preparation: 32 parts of unsaturated polyester resin, 16 parts of silicone resin, 1 part of cross-linking agent, 0.1 part of color paste, 22 parts of aluminum hydroxide, 13 parts of calcium carbonate, 0.5 part of accelerator, 3 parts of titanium dioxide and 3 parts of curing agent.

The selected color paste comprised organic pigment. The organic pigment was 0.05 part. The organic pigment comprised 0.02 part of triarylmethane pigment and 0.03 part of polycyclic pigment.

The above powders were mixed and stirred in a vacuum blender to obtain a uniformly stirred unsaturated polyester resin mixture.

Molding: According to the thickness requirement, the powders were weighed and put into a mold for vacuumizing and casting molding.

Curing: Curing was conducted by standing at 50° C. for 1 h to form a green body with desired shape (plate type).

Surface processing: The post-sintered product was subject to optical grinding and polishing treatment and hydrophobization treatment to form an artificial light-transmitting resin plate with good light transmission performance and appreciated appearance.

A monocrystalline silicon solar cell sheet was selected as the power-generating layer. A cement substrate material was selected as the substrate. The substrate was covered with the functional layer and the functional layer was covered with the monocrystalline silicon solar cell sheet. The material of the functional layer was EVA.

Figure 3:
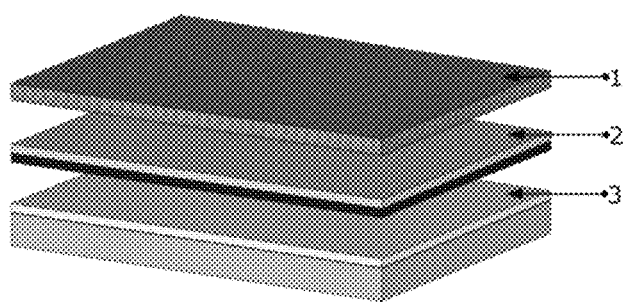
FIG. 3 is a structural diagram of a photovoltaic building material of the present disclosure, in which 1 is a surface layer; 2 is a power-generating layer; and 3 is a substrate layer.
Figure 4:
FIG. 4 is a side view of the structural diagram of the photovoltaic building material shown in FIG. 3, in which 1 is a surface layer; 2-1 is a glue film; 2-2 is a solar cell layer; 3-1 is a glue film; 3-2 is a substrate; 2*2 is a negative electrode surface; 2*3 is a positive electrode surface; e1 is an extracted negative electrode; and e2 is an extracted positive electrode.

The surface of the power-generating layer was covered with the prepared artificial light-transmitting resin plate. The power-generating layer and the optical adjustment layer were adhered by the EVA and were insulated from each other. The solar cell was isolated from the water vapor. A power-generating panel with artificial light-transmitting resin plate optical adjustment layer was prepared. The structural diagram was shown in FIGS. 3 and 4. The efficiency of the cell with artificial light-transmitting resin plate was 14%.

Example 6

The optical adjustment layer was an artificial light-transmitting resin sheet with a thickness of 5 mm. The percentage of water vapor permeation was 0% and the hardness was 6H.

The preparation process comprised: powder preparation, molding, curing and surface processing.

Powder preparation: 40 parts of unsaturated polyester resin, 18 parts of silicone resin, 1 part of cross-linking agent, 0.5 part of color paste, 18 parts of aluminum hydroxide, 15 parts of calcium carbonate, 3 parts of accelerator, 4 parts of titanium dioxide and 1 part of curing agent.

Sodium tripolyphosphate may additionally be added as a dispersing agent.

The selected color paste was an organic pigment and comprised 0.3 part of azo pigment and 0.2 part of polycyclic pigment.

The above powders were mixed and stirred in a vacuum blender to obtain a uniformly stirred unsaturated polyester resin mixture.

Molding: The above raw materials according to thickness were weighed and put into a mold for vacuumizing and casting molding.

Curing: Curing was conducted by standing at room temperature for 2 h to form a green body with desired shape (plate type).

Surface Processing: The post-cured product was subject to optical grinding and polishing treatment and hydrophobization treatment to form an artificial light-transmitting resin plate with good light transmission performance and appreciated appearance The artificial light-transmitting resin plate prepared in accordance with present disclosure had strong compactness, corrosion resistance and hardness and no harm to human bodies.

A polycrystalline silicon solar cell sheet was selected as the power-generating layer. A ceramic material was selected as the substrate. The substrate was covered with the functional layer and the functional layer was covered with the polycrystalline silicon solar cell sheet. The material of the functional layer was EVA.

The surface of the power-generating layer was covered with the prepared decorative protective layer optical adjustment layer. The power-generating layer of the solar cell assembly and the protective layer were adhered by the EVA and sealed by lamination and were insulated from each other. The solar cell was isolated from the water vapor. A power-generating building material of the solar cell assembly with artificial light-transmitting resin plate was prepared. The efficiency of the power-generating building material with artificial light-transmitting resin plate was 11.5%.

Example 7

The optical adjustment layer was a layer of color-glazed glass with a thickness of 5 mm. The percentage of water vapor permeation was 0 and the hardness was 8H. The preparation process was as follows:

Slurry preparation: by weight, 75 parts of albite, 20 parts of quartz stone, 6 parts of calcium carbonate, 8 parts of talcum powder, 20 parts of calcium silicate, 3 parts of aluminum oxide, 5 parts of sodium hydroxide and 0.4 part of color paste.

The selected color paste comprised 0.1 part of carbon black, 0.05 part of mica, 0.1 part of realgar, 0.1 part of iron oxide red and 0.05 part of iron oxide yellow.

The above materials were added into deionized water. The solid particle size was reduced by means of ball milling. The materials were uniformly distributed in an aqueous solution to form a slurry. The mixture was stirred uniformly.

The slurry was applied to the industrial glass in a printed manner. The coating thickness was 0.2 mm. Different spray heads can be used during printing. A heating air gun was arranged beside the spray head, so that no flow marks occurred. The spray heads had more accurate control on the flow rate of the printing slurry.

The glass coated with the slurry was then placed in an oven and dried. The baking temperature was 45° C. and the baking time was 2 h.

The dried slurry/glass was then placed in a kiln for baking at 750° C. for 4 h.

A copper indium gallium selenide solar cell was selected as power-generating layer. A cement substrate material was selected as a substrate.

The surface of the power-generating layer was covered with the prepared optical adjustment layer. The power generating layer and the optical adjustment layer were adhered by the EVA and insulated from each other. The solar cell is isolated from the water vapor. A power-generating panel with a color-glazed glass optical adjustment layer was prepared. The efficiency of the cell after the optical adjustment layer was prepared on the surface of the cell was 11.7%.

Example 8

The optical adjustment layer was a layer of a light-transmitting ceramic with a thickness of 20 mm. The percentage of water vapor permeation was 0.5% and the hardness was 6H. The light-transmitting ceramic product was subject to optical grinding and polishing treatment and hydrophobic treatment, so that the optical adjustment layer with good light transmission performance and appreciated appearance was formed.

A copper indium gallium selenide solar cell was selected as the power-generating layer. A cement substrate material was selected as the substrate.

Figure 5:
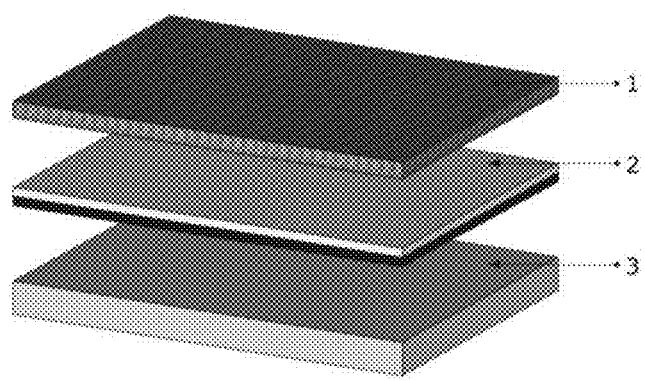
FIG. 5 is a structural diagram of a photovoltaic building material of the present disclosure, in which 1 is a surface layer; 2 is a power-generating layer; and 3 is a substrate layer.
Figure 6:
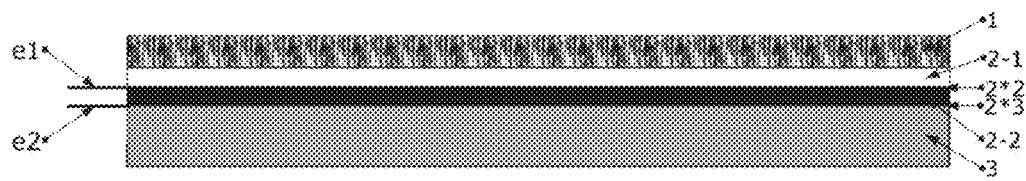
FIG. 6 is a side view of the structural diagram of the photovoltaic building material shown in FIG. 5, in which 1 is a surface layer; 3 is a substrate layer; 2-1 is a glue film; 2-2 is a solar cell layer; 2*2 is a negative electrode surface; 2*3 is a positive electrode surface; e1 is an extracted negative electrode; and e2 is an extracted positive electrode.

The surface of the power-generating layer was covered with the prepared light-transmitting ceramic optical adjustment layer. The power-generating layer and the optical adjustment layer were adhered by EVA and were insulated from each other. The solar cell was isolated from the water vapor. A power-generating panel with light-transmitting ceramic was prepared. The structural diagram was shown in FIGS. 5 and 6. The conversion efficiency of the power-generating panel after the light-transmitting ceramic optical adjustment layer was prepared on the surface of the cell was 12.0%.

Example 9

The optical adjustment layer was a layer of a light-transmitting ceramic with a thickness of 5 mm. The percentage of water vapor permeation was 0.1% and the hardness was 9H. The light-transmitting ceramic product was subject to optical grinding and polishing treatment and hydrophobic treatment, so that the transparent ceramic optical adjustment layer with good light transmission performance and appreciated appearance was formed.

A copper indium gallium selenide solar cell was selected as the power-generating layer. A building glass was selected as the substrate.

The surface of the power-generating layer was covered on the prepared light-transmitting ceramic optical adjustment layer. The power-generating layer and the light-transmitting ceramic optical adjustment layer were adhered by the EVA and were insulated from each other. The solar cell was isolated from the water vapor. A power-generating panel with light-transmitting ceramic was prepared. The cell efficiency after the light-transmitting ceramic optical adjustment layer was prepared on the surface of the cell was 11%.

Example 10

The optical adjustment layer was a layer of ultra-thin stone with a thickness of 1 mm. The percentage of water vapor permeation was 0.5% and the hardness was 7H. The preparation process was as follows:

The type of stone material was sedimentary rock. The surface of the stone material was polished and cleaned.

The curing adhesive was silicone and epoxy resin.

The silicone was coated on the polished surface of the stone material, and the surface of the stone material was covered with a layer of glass fiber cloth. The glue was cured by standing at 100° C. for 20 min. The surface of the glass fiber cloth was then coated with the epoxy resin and the surface of the epoxy resin was covered with a layer of glass fiber cloth. The glue was cured by standing at room temperature for 20 min.

The glass fiber cloth was torn off from the stone substrate by mechanical means to obtain the glass fiber cloth with the stone on the surface. The surface of the torn stone away from the glass fiber cloth was polished.

The glass fiber cloth and the torn stone were separated by acetone solution.

Hydrophobic treatment was performed on the ultra-thin stone product, so that the ultra-thin stone optical adjustment layer with good light transmission performance and appreciated appearance was formed.

The ultra-thin stone (optical adjustment layer) prepared in accordance with the present disclosure had strong corrosion resistance and higher hardness and no harm to human bodies. The ultra-thin stone had beautiful appearance of sedimentary rock and good decorative property.

A cadmium telluride solar cell was selected as the power-generating layer. A concrete was selected as the substrate.

The surface of the power-generating layer was covered with the prepared optical adjustment layer. The power-generating layer and the optical adjustment layer were adhered by EVA and were insulated from each other. The solar cell was isolated from the water vapor. A power-generating panel with ultra-thin stone optical adjustment layer was prepared. The efficiency of the cell after the optical adjustment layer was prepared on the surface of the cell was 12.5%.

Example 11

The optical adjustment layer was a layer of ultra-thin stone with a thickness of 0.2 mm. The percentage of water vapor permeation was 0.3% and the hardness was 6H. The preparation process was as follows:

The type of stone material was shale. The surface of the stone material was polished and cleaned.

The curing adhesive was epoxy resin.

The epoxy resin was coated on the polished surface of the stone material, and the surface of the stone material was covered with a layer of glass fiber cloth. The glue was cured by standing at 25° C. for 30 min. The surface of the glass fiber cloth was then coated with the epoxy resin and the surface of the epoxy resin was covered with a layer of glass fiber cloth. The glue was cured by standing at 25° C. for 30 min.

The glass fiber cloth was torn off from the stone substrate by mechanical means to obtain the glass fiber cloth with the stone on the surface. The surface of the torn stone away from the glass fiber cloth was polished.

The glass fiber cloth and the torn stone were separated by acetone solution.

Hydrophobic treatment was performed on the ultra-thin stone product, so that the ultra-thin stone optical adjustment layer with good light transmission performance and appreciated appearance was formed.

The ultra-thin stone prepared in accordance with the present disclosure had strong corrosion resistance and higher hardness and no harm to human bodies. The ultra-thin stone had beautiful appearance of shale and good decorative property.

An amorphous silicon solar cell was selected as the power-generating layer. A metal plate was selected as the substrate.

The surface of the power-generating layer was covered with the prepared optical adjustment layer. The power-generating layer and the optical adjustment layer were adhered by EVA and were insulated from each other. The solar cell was isolated from the water vapor. A power-generating panel with ultra-thin stone optical adjustment layer was prepared. The efficiency of the cell after the optical adjustment layer was prepared on the surface of the cell was 9.5%.

Example 12

The optical adjustment layer was an artificial light-transmitting resin sheet with a thickness of 0.1 mm. The percentage of water vapor permeation was 0.5% and the hardness was 6H. The preparation process comprised: powder preparation, molding, curing and surface processing.

Powder preparation: 32 parts of unsaturated polyester resin, 16 parts of silicone resin, 1 part of cross-linking agent, 0.1 part of color paste, 22 parts of aluminum hydroxide, 13 parts of calcium carbonate, 0.5 part of accelerator, 3 parts of titanium dioxide and 3 parts of curing agent.

The selected color paste comprised organic pigment. The organic pigment was 0.05 part. The organic pigment comprised 0.02 part of triarylmethane pigment and 0.03 part of polycyclic pigment.

The above powders were mixed and stirred in a vacuum blender to obtain a uniformly stirred unsaturated polyester resin mixture.

Molding: According to the thickness requirement, the powders were weighed and put into a mold for vacuumizing and casting molding.

Curing: Curing was conducted by standing at 50° C. for 1 h to form a green body with desired shape (plate type).

Surface processing: The post-sintered product was subject to optical grinding and polishing treatment and hydrophobization treatment to form an artificial light-transmitting resin plate with good light transmission performance and appreciated appearance.

The artificial light-transmitting resin plate prepared in accordance with the present disclosure had strong compactness, corrosion resistance and hardness and no harm to human bodies.

A monocrystalline silicon solar cell sheet was selected as the power-generating layer. A cement substrate material was selected as the substrate. The substrate was covered with the functional layer and the functional layer was covered with the monocrystalline silicon solar cell sheet. The material of the functional layer was EVA.

Figure 7:
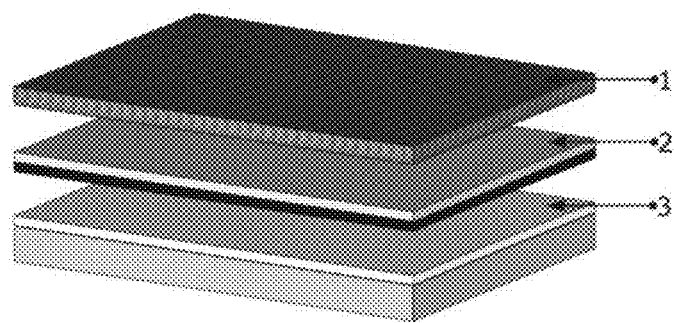
FIG. 7 is a structural diagram of a photovoltaic building material of the present disclosure, in which 1 is a surface layer; 2 is a power-generating layer; and 3 is a substrate layer.
Figure 8:
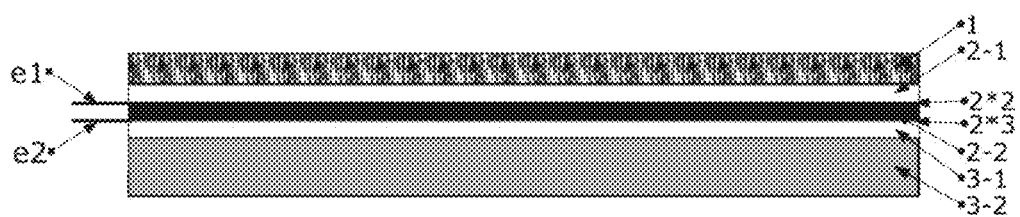
FIG. 8 is a side view of the structural diagram of the photovoltaic building material shown in FIG. 7, in which 1 is a surface layer; 2-1 is a glue film; 2-2 is a solar cell layer; 3-1 is a glue film; 3-2 is a substrate; 2*2 is a negative electrode surface; 2*3 is a positive electrode surface; e1 is an extracted negative electrode; and e2 is an extracted positive electrode.

The surface of the power-generating layer was covered with the prepared artificial light-transmitting resin plate. The power-generating layer and the optical adjustment layer were adhered by the EVA and were insulated from each other. The solar cell was isolated from the water vapor. A power-generating panel with artificial light-transmitting resin plate optical adjustment layer was prepared. The structural diagram was shown in FIGS. 7 and 8. The efficiency of the cell with artificial light-transmitting resin plate was 14%.

Example 13

The optical adjustment layer was an artificial light-transmitting resin sheet with a thickness of 5 mm. The percentage of water vapor permeation was 0% and the hardness was 6H. The preparation process comprised: powder preparation, molding, curing and surface processing.

Powder preparation: 40 parts of unsaturated polyester resin, 18 parts of silicone resin, 1 part of cross-linking agent, 0.5 part of color paste, 18 parts of aluminum hydroxide, 15 parts of calcium carbonate, 3 parts of accelerator, 4 parts of titanium dioxide and 1 part of curing agent.

Sodium tripolyphosphate may additionally be added as a dispersing agent.

The selected color paste was an organic pigment and comprised 0.3 part of azo pigment and 0.2 part of polycyclic pigment.

The above powders were mixed and stirred in a vacuum blender to obtain a uniformly stirred unsaturated polyester resin mixture.

Molding: The above raw materials according to thickness were weighed and put into a mold for vacuumizing and casting molding.

Curing: Curing was conducted by standing at room temperature for 2 h to form a green body with desired shape (plate type).

Surface Processing: The post-cured product was subject to optical grinding and polishing treatment and hydrophobization treatment to form an artificial light-transmitting resin plate with good light transmission performance and appreciated appearance The artificial light-transmitting resin plate prepared in accordance with present disclosure had strong compactness, corrosion resistance and hardness and no harm to human bodies.

A polycrystalline silicon solar cell sheet was selected as the power-generating layer. A ceramic material was selected as the substrate. The substrate was covered with the functional layer and the functional layer was covered with the polycrystalline silicon solar cell sheet. The material of the functional layer was EVA.

The surface of the power-generating layer was covered with the prepared decorative protective layer optical adjustment layer. The power-generating layer of the solar cell assembly and the protective layer were adhered by the EVA and sealed by lamination and were insulated from each other. The solar cell was isolated from the water vapor. A power-generating building material of the solar cell assembly with artificial light-transmitting resin plate was prepared. The efficiency of the power-generating building material with artificial light-transmitting resin plate was 11.5%.

Example 14

The optical adjustment layer was a layer of color-glazed glass with the thickness of 1 mm, which comprised a substrate and a glazed layer, wherein the substrate was a building glass. The percentage of water vapor permeation was 0 and the hardness was 8H. The specific step of preparing the glazed layer comprised: slurry preparation, printing and coating, drying and sintering.

Slurry preparation: 70 parts of albite, 15 parts of quartz stone, 6 parts of calcium carbonate, 8 parts of talcum powder, 10 parts of calcium silicate, 3 parts of aluminum oxide, 1 part of sodium hydroxide and 1 part of color paste.

The selected color paste comprised 0.3 part of azo pigment, 0.4 part of phthalocyanine pigment, 0.2 part of triarylmethane pigment and 0.1 part of polycyclic pigment.

The above materials were added into deionized water. The solid particle size was reduced by means of ball milling. The materials were uniformly distributed in an aqueous solution to form a slurry. The mixture was stirred uniformly.

The slurry was applied to the industrial glass in a printed manner. The coating thickness was 0.2 mm. Different spray heads can be used during printing. A heating air gun was arranged beside the spray head, so that no flow marks occurred. The spray heads had more accurate control on the flow rate of the printing slurry.

The glass coated with the slurry was then placed in an oven and dried. The baking temperature was 25° C. and the baking time was 30 min.

The dried slurry/glass was then placed in a kiln for baking at 550° C. for 3 h.

A cadmium telluride solar cell was selected as the power-generating layer. An engineering plastic was selected as the substrate.

The surface of the power-generating layer was covered with the prepared optical adjustment layer. The power-generating layer and the optical adjustment layer were adhered by EVA and were insulated from each other. The solar cell was isolated from the water vapor. A power-generating panel with color-glazed glass optical adjustment layer was prepared. The efficiency of the cell after the optical adjustment layer was prepared on the surface of the cell was 12.5%.

Example 15

The optical adjustment layer was a layer of color-glazed glass with a thickness of 5 mm. The percentage of water vapor permeation was 0 and the hardness was 8H. The preparation process was as follows:

Slurry preparation: by weight, 75 parts of albite, 20 parts of quartz stone, 6 parts of calcium carbonate, 8 parts of talcum powder, 20 parts of calcium silicate, 3 parts of aluminum oxide, 5 parts of sodium hydroxide and 0.4 part of color paste.

The selected color paste comprised 0.1 part of carbon black, 0.05 part of mica, 0.1 part of realgar, 0.1 part of iron oxide red and 0.05 part of iron oxide yellow.

The above materials were added into deionized water. The solid particle size was reduced by means of ball milling. The materials were uniformly distributed in an aqueous solution to form a slurry. The mixture was stirred uniformly.

The slurry was applied to the industrial glass in a printed manner. The coating thickness was 0.2 mm. Different spray heads can be used during printing. A heating air gun was arranged beside the spray head, so that no flow marks occurred. The spray heads had more accurate control on the flow rate of the printing slurry.

The glass coated with the slurry was then placed in an oven and dried. The baking temperature was 45° C. and the baking time was 2 h.

The dried slurry/glass was then placed in a kiln for baking at 750° C. for 4 h.

A copper indium gallium selenide solar cell was selected as power-generating layer. A cement substrate material was selected as a substrate.

The surface of the power-generating layer was covered with the prepared optical adjustment layer. The power generating layer and the optical adjustment layer were adhered by the EVA and insulated from each other. The solar cell is isolated from the water vapor. A power-generating panel with a color-glazed glass optical adjustment layer was prepared. The efficiency of the cell after the optical adjustment layer was prepared on the surface of the cell was 11.7%.

Example 16

The photovoltaic building material substrate was a flexible stainless steel foil with a thickness of 0.2 mm. A power-generating layer was arranged on the photovoltaic building material substrate. A wire was arranged to extract an electrode. A surface layer was disposed on the power-generating layer.

The process for preparing the power-generating layer was as follows:

The flexible stainless steel foil substrate was washed and placed in a magnetron sputtering machine. In order to prevent the elements in the stainless steel from diffusing into the solar cell, firstly, a 0.5 μm WTi barrier layer was sputtered. The working gas was Ar gas. The sputtering gas pressure was 0.7 Pa. The background vacuum was $2.0 \times 10^{-3}$ Pa. The substrate was not heated during sputtering. A Mo film was prepared by a three-sublayer process. The sputtering pressure of the first layer was 1.5 Pa. The sputtering pressure of the second layer was 0.6 Pa. The sputtering pressure of the third layer was 1.5 Pa. A 1.2 μm to 2 μm CIGS film was deposited by sputtering on the Mo film at a sputtering gas pressure of 0.7 Pa and a background vacuum of $1.5 \times 10^{-3}$ Pa, followed by selenization annealing treatment. The selenized film was placed in a mixing solution of cadmium sulfate, thiourea, and ammonia. 30 nm to 50 nm CdS was deposited at 70° C. Then, the film was placed in the sputtering chamber again. The working gas was $O_2$ and Ar. The sputtering pressure was 0.7 Pa. The background vacuum was $2.0 \times 10^{-3}$ Pa. The substrate temperature was kept at 150° C. to 200° C. during sputtering. Intrinsic ZnO film and AZO film were deposited, separately. Finally, a Ni—Al gate was deposited by evaporation to prepare a flexible thin-film solar cell panel. A layer of aluminum nitride with a thickness of 3 μm was deposited by RF sputtering to finally prepare the power-generating layer.

The surface layer was prepared by printing method. The mixing solution of the raw material of the surface layer comprised a curing mother liquor, a light diffusing agent and a coloring agent. The curing mother liquor comprised 21 parts of soap-free polymerized silicone acrylic emulsion, 90 parts of self-crosslinking silicone acrylic emulsion copolymerized with a core-shell structure and 70 parts of silicone grafted acrylate emulsion. The light diffusing agent comprised spherical polymethyl methacrylate with a particle size of 0.8 μM. The mass fraction of the light diffusing agent in the mixing solution was 0.3%. The coloring agent comprised malachite and ultramarine violet pigment, of which the particle size distribution was 30 nm to 150 nm. The proportion of the pigment in the mixing solution was 0.5%. Moreover, the mixing solution of the raw material of the surface layer also comprised 40 parts of water, 1.5 parts of 5040 dispersing agent and 2.5 parts of M30 bactericide. The thickness of the prepared surface layer was 0.02 mm. The curing temperature was 90° C. and the curing time was 1 h. The prepared surface layer had a transmittance of 85% and a haze of 52%.

Example 17

A photovoltaic building material comprised the substrate, which was glass and had a thickness of 2.0 mm. A cell layer was disposed on the substrate and had wires to extract electrodes. The process for preparing the cell was similar to that of Example 1, except that the CIGS film was replaced with $Cu_2(ZnSn)(SSe)_4$ and the post-treatment process of the film was replaced with selenization or vulcanization. A protective layer was disposed on the cell layer. The protective layer was EVA and glass.

The surface layer was prepared by manual spraying method. The mixing solution of the raw material of the surface layer comprised a curing mother liquor, a light diffusing agent and a coloring agent. The curing mother liquor comprised 45 parts of water glass which was a mixture of potassium water glass and sodium water glass in a ratio of 2:1. The light diffusing agent comprised a silicone light diffusing agent with a particle size of 7 μm. The mass fraction of the light diffusing agent in the mixing solution was 2%. The coloring agent comprised phthalocyanine red and zinc white. The ratio of the pigment to the mixing solution was 0.9%. Moreover, the mixing solution of the raw material of the surface layer further comprised 20 parts of filler, which was the mixture of talcum powder and calcium carbonate, and 1 part of silicon gel.

The thickness of the surface layer prepared in the present Example was 2 mm. The curing temperature was 20° C. and the curing time was 2 h.

The surface layer of the photovoltaic building material had a transmittance curve of visible light between 300 nm and 1,300 nm, a weighted average transmittance of 35% and a haze of 10%.

A protective layer of the photovoltaic building material of the present disclosure can also be obtained in other ways, such as coating a liquid mixture on the surface of the power-generating layer by scraping, printing and flow paddles.

Example 18

A photovoltaic building material comprised the substrate, which was ceramic and had a thickness of 8.0 mm. A cell layer was disposed on the substrate and had wires to extract electrodes. The cell layer had a CdTe solar cell structure. The specific preparation process was as follows. Firstly, the washed substrate was placed in a sputtering apparatus. The working gas was Ar gas. The sputtering gas pressure was 0.7 Pa. The background vacuum was $1.8 \times 10^{-3}$ Pa. A transparent conductive indium tin oxide thin-film was sputtered and deposited on the substrate. Subsequently, a CdS slurry was coated to form a film by screen printing method. The film was dried at 90° C. to 100° C. for 1 to 3 h and sintered in a nitrogen atmosphere for 0.5 to 2 h at 650° C. to 710° C. A slurry comprising CdTe powder was printed on the CdS film and sintered for 1 h. Finally, a carbon electrode and an Ag slurry were printed on CdTe as extraction electrodes. A protective layer was disposed on the cell layer. The protective layer was PVB and ETFE. The surface layer was prepared on the protective layer. The thickness of the surface layer was 0.1 mm. The raw materials of the surface layer were as follows.

The mixing solution of the raw material of the surface layer comprised a curing mother liquor, a light diffusing agent and a coloring agent. The 60 parts of the curing mother liquor comprised a mixture of the fluorocarbon resin emulsion and the polyacrylic acid emulsion in a ratio of 3:1. The light diffusing agent comprised polystyrene, of which the particle size was 2 μm. The mass fraction of the light diffusing agent in the mixing solution was 4%. The coloring agent comprised a mixture of ultramarine blue, organic green, and toluidine red. The ratio of the pigment to the mixing solution was 1.5%. Moreover, the mixing solution of the raw material of the surface layer further comprised 15 parts of filler, which was a mixture of wollastonite powder, quartz powder and bentonite in the ratio of 1:1.5:0.8, 0.2 part of dimethyl sulfoxide, 1.1 parts of sodium polycarboxylate and 0.3 part of emulsified silicone oil.

The liquid raw materials constituting the surface layer were coated on the surface of power-generating layer by spraying, printing and flow paddle. The curing temperature was 90° C. and the curing time was 0.2 s. The surface layer had a transmittance curve of visible light between 300 nm and 1,300 nm, a weighted average transmittance of 52% and a haze of 50%.

Example 19

A photovoltaic building material comprised a substrate, which was aluminum nitride ceramic and had a thickness of 10.0 mm. A cell layer, which was amorphous silicon cell, was disposed on the substrate and had wires to extract electrodes. A protective layer was disposed on the cell layer. The protective layer was made with a silica ceramic film and had a thickness of 15 μm. The silica was prepared by reactive sputtering. The reactive sputtering was carried out after the vacuum chamber was pumped to pressure of $2.0 \times 10^{-3}$ Pa. The sputtering was carried out under the constant power sputtering of 600 W, the sputtering gas pressure of 0.6 Pa, the sputtering atmosphere of Ar and $O_2$, wherein Ar:$O_2$ was 3:1. The target was monocrystalline silicon with 6N purity. The target base distance was 60 mm.

The surface layer was prepared by a printing method. The mixing solution of the raw material of the surface layer comprised a curing mother liquor, a light diffusing agent and a coloring agent in parts by weight. The curing mother liquor comprised 75 parts of water glass, which was a mixture of potassium water glass and sodium water glass in a ratio of 1:1. The light diffusing agent comprised a polymethyl methacrylate light diffusing agent with a particle size of 1 μm. The mass fraction of the light diffusing agent in the mixing solution was 3%. The coloring agent comprised phthalocyanine red and gold cloud masterbatch. The ratio of the pigment to the mixing solution was 1.0%. Moreover, the mixing solution of the raw material of the surface layer further comprised 20 parts of filler, which comprised wollastonite powder, aluminum silicate and kaolin in a ratio by weight of 3:2:5, and 0.5 part of silicon gel.

The surface layer of the photovoltaic building material had a transmittance curve of visible light between 300 nm and 1,300 nm, a weighted average transmittance of 45% and a haze of 40%.

A protective layer of the photovoltaic building material of the present disclosure can also be obtained in other ways, such as coating a liquid mixture on the surface of the power-generating layer by scraping, printing and flow paddles.

Example 20

A photovoltaic building material comprised a polycrystalline silicon component product. The substrate was a ceramic tile with a water absorption rate of less than 1%. The thickness of the substrate was 5 mm. The power-generating layer had wires to extract electrodes. A protective layer was disposed on the cell layer. The protective layer was a silicon dioxide ceramic film.

The surface layer was prepared by an automatic spraying method. The mixing solution of the raw material of the surface layer comprised a curing mother liquor, a light diffusing agent and a coloring agent. The 70 parts of the curing mother liquor comprised a mixture of the fluorocarbon resin emulsion and the polyacrylic acid emulsion in a ratio of 1:1. The light diffusing agent comprised polystyrene, of which the particle size was 2 μm. The mass fraction of the light diffusing agent in the mixing solution was 1%. The coloring agent comprised pearlescent pigment. The ratio of the pigment to the mixing solution was 1.25%. Moreover, the mixing solution of the raw material of the surface layer further comprised 10 parts of filler, which was a mixture of quartz powder and precipitated barium sulfate in the ratio of 2:3, 0.4 part of glycerin and 1.0 part of sodium polycarboxylate.

Figure 9:
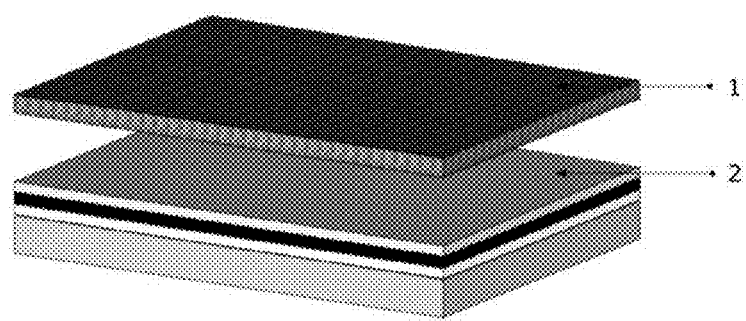
FIG. 9 is a structural diagram of a photovoltaic building material of the present disclosure, in which 1 is a surface layer; and 2 is a power-generating layer.
Figure 10:
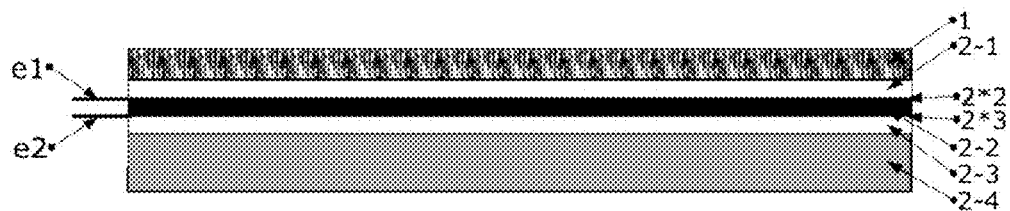
FIG. 10 is a side view of the structural diagram of the photovoltaic building material shown in FIG. 9, in which 1 is a surface layer; 2-1 is a ceramic film; 2-2 is a solar cell layer; 2-3 is a glue film; 2-4 is a substrate; 2*2 is a negative electrode surface; 2*3 is a positive electrode surface; e1 is an extracted negative electrode; and e2 is an extracted positive electrode.
Figure 11:
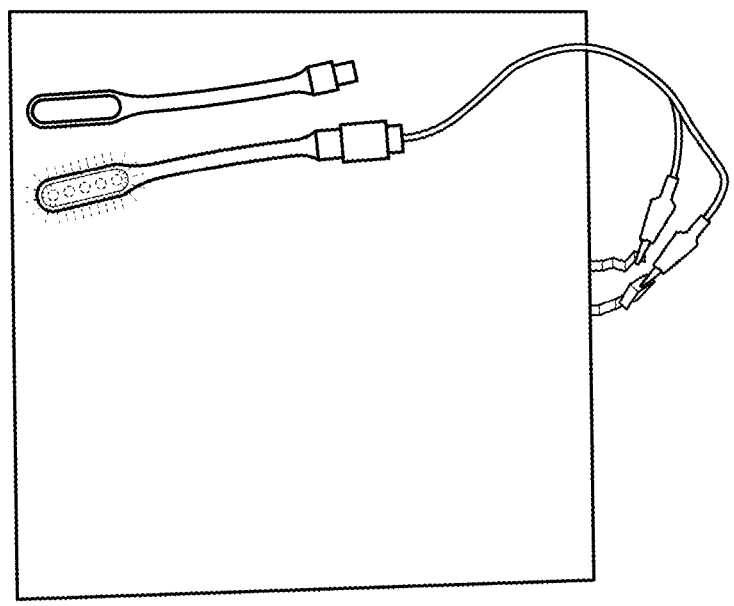
FIG. 11 is a diagram of a physical power-generating building material prepared according to the present disclosure.

The thickness of the surface layer was 0.3 mm. The curing temperature was 50° C. The curing time was 1 s. The photovoltaic building material had a transmittance curve of visible light between 300 nm and 1,300 nm. The weighted average transmittance was 45% and the haze was 95%. The structure of the photovoltaic building material was shown in FIGS. 9 and 10.

Example 21

A photovoltaic building material comprised a monocrystalline silicon component product. The substrate was a glass with a thickness of 2 mm. The power-generating layer had wires to extract electrodes. A protective layer was disposed on the power-generating layer. The protective layer comprised silica gel and a front film. The front film was ETFE.

The surface layer was prepared by a spin coating method. The mixing solution of the raw material of the surface layer comprised a curing mother liquor, a light diffusing agent and a coloring agent. The curing mother liquor was prepared with 28 parts of soap-free polymerized silicone acrylic emulsion, 70 parts of self-crosslinked silicone acrylic emulsion copolymerized with a core-shell structure and 110 parts of silicone grafted acrylate emulsion. The light diffusing agent comprised spherical polystyrene with the particle size of 2.5 μm. The mass fraction of the light diffusing agent in the mixing solution was 1%. The colorant comprised a mixture of sun-resistant red lake and acid lake blue lake. The ratio of the dye to the mixing solution was 0.9%. Moreover, the mixing solution of the surface layer raw material further comprised 2 parts of 250 HBR cellulose and 2.5 parts of M30 bactericide. The thickness of the surface layer prepared was 0.05 mm. The curing temperature was −20° C. and the curing time was 30 h.

The power-generating building material surface layer prepared in the present Example had a weighted average transmittance of 55% between 300 nm and 1,300 nm and a haze of 70%.

Figure 13:
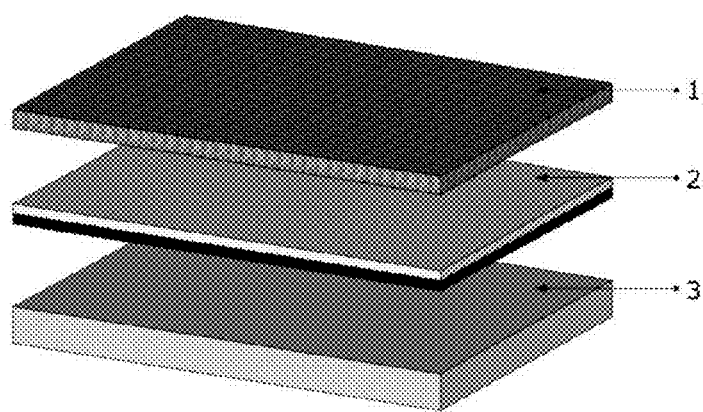
FIG. 13 is a structural diagram of a power-generating building material (comprising a ceramic film) of the present disclosure, in which 1 is a protective layer of the building material; 2 is a photoelectric conversion layer; and 3 is a substrate layer of the building material.
Figure 14:
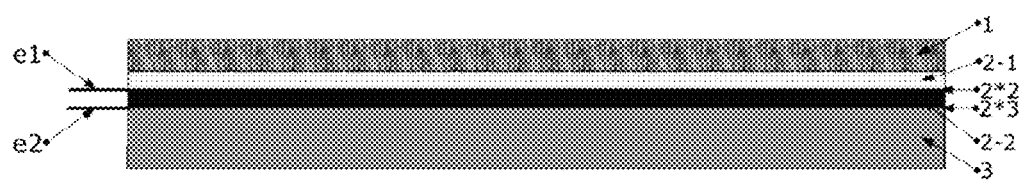
FIG. 14 is a side view of the structural diagram of the power-generating building material shown in FIG. 11, in which 1 is a protective layer of the building material; 2-1 is a ceramic film; 2-2 is a solar cell layer; 2*2 is a negative electrode surface; 2*3 is a positive electrode surface; e1 is an extracted negative electrode; e2 is an extracted positive electrode; and 3 is a substrate layer.

FIGS. 13 and 14 showed a structural diagram of a power-generating building material.

The power-generating building material comprised a protective layer of the surface of the building material, a photoelectric conversion layer and a substrate layer of the building material.

The substrate layer of the building material comprised one of glass, metal plate, cement-based fiber board, flexible plastic film and ceramic tile.

The photoelectric conversion layer comprised copper indium gallium selenide (CIGS) solar cell, gallium arsenide (GaAs) solar cell, amorphous silicon solar cell, cadmium telluride (CdTe) solar cell, dye-sensitized solar cell, copper zinc tin sulfur (CZTS) solar cell, or perovskite solar cell.

The protective layer of the surface of the building material had a weighted average transmittance of 10% to 85% over a wavelength range of 300 nm to 1,300 nm. The thickness of the protective layer was 0.01 mm to 5 mm. A thicker protective layer of the surface of the building material can bring a better protection effect, but can lead to a reduction in transmittance.

Example 22

A power-generating building material comprised a substrate, which was a flexible stainless steel foil and had a thickness of 0.2 mm. A photoelectric conversion layer was disposed on the substrate and had wires to extract electrodes. A protective layer of surface of the building material was disposed on the photoelectric conversion layer.

The preparation process was as follows:

The flexible stainless steel foil substrate was washed and placed in a magnetron sputtering machine. In order to prevent the elements in the stainless steel from diffusing into the solar cell, firstly, a 0.5 μm WTi barrier layer was sputtered. The working gas was Ar gas. The sputtering gas pressure was 0.7 Pa. The background vacuum was $2.0 \times 10^{-3}$ Pa. The substrate was not heated during sputtering. The Mo film was prepared by a three-sublayer process. The sputtering pressure of the first layer was 1.5 Pa. The sputtering pressure of the second layer was 0.6 Pa. The sputtering pressure of the third layer was 1.5 Pa. A 1.2 μm CIGS film was deposited by sputtering on the Mo film at a sputtering gas pressure of 0.7 Pa and a background vacuum of $1.5 \times 10^{-3}$ Pa, followed by selenization annealing treatment. The selenized film was placed in a mixing solution of cadmium sulfate, thiourea, and ammonia, 50 nm CdS was deposited. Then, the film was placed in the sputtering chamber again. The working gas was $O_2$ and Ar. The sputtering pressure was 0.7 Pa. The background vacuum was $2.0 \times 10^{-3}$ Pa. The substrate temperature was kept at 200° C. during sputtering. Intrinsic ZnO film and AZO film were deposited, separately. Finally, a NiAl gate was deposited by evaporation to prepare a flexible CIGS thin-film solar cell panel. A layer of aluminum nitride with a thickness of 3 μm was deposited by RF sputtering to finally prepare the power-generating layer.

The raw materials of the protective layer of the surface of the building material comprised: based on parts by weight, 155 parts of mother liquor and 7 parts of pigment, which comprised the same weight of titanium dioxide, iron oxide red powder, iron oxide yellow, phthalocyanine blue and chromium oxide green. The mother liquor comprised 764 parts of deionized water, 0.4 part of A1522 cross-linking agent, 3 parts of 250HBR cellulose, 1.5 parts of 5040 dispersing agent, 1.5 parts of AMP-95 multifunctional auxiliary agent, 2.5 parts of M30 bactericide, 21 parts of R103 forming agent, 4 parts of ethylene glycol, 9.5 parts of C-12 film forming auxiliary agent, 0.1 part of silicone light diffusing agent, 0.02 part of semiconductor cerium oxide quantum dot and 0.001 part of graphene, 21 parts of non-soap-polymerized silicone acrylic emulsion, 90 parts of self-crosslinked silicone acrylic emulsion copolymerized with a core-shell structure and 70 parts of silicone grafted acrylate emulsion. The protective layer of the surface of the building material was prepared by printing method. The thickness of the protective layer of the surface of the building material was 0.5 mm. The sample of the protective layer of the surface of the building material was cured at 100° C. for 0.1 s to obtain the power-generating building material.

The structure of the power-generating building material prepared in Example 22 was shown in FIGS. 13 and 14, and the photoelectric conversion rate of the prepared power-generating building material was 12.3%.

Figure 12:
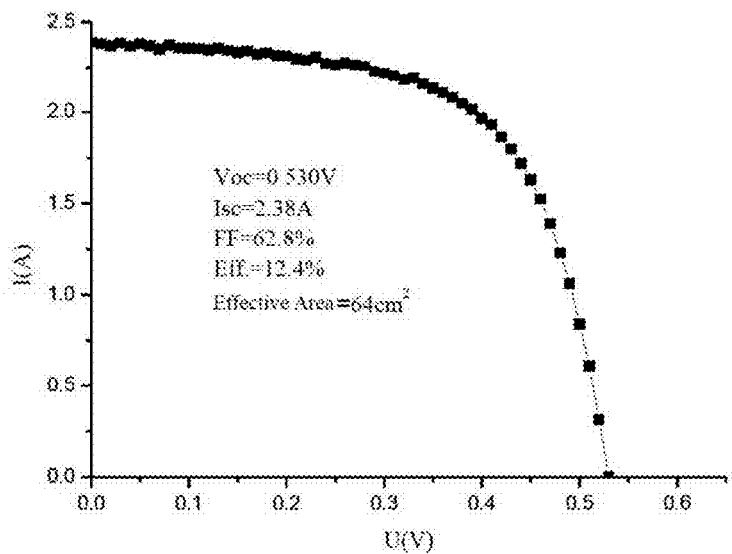
FIG. 12 is an I-V curve of the power-generating building material prepared in Example 22.

FIG. 12 showed an I-V curve of the power-generating building material prepared according to Example 22.

Example 23

A photovoltaic building material comprised the substrate, which was glass and had a thickness of 2.0 mm. A photoelectric conversion layer was disposed on the substrate and had wires to extract electrodes. The process for preparing the photoelectric conversion layer was similar to that of Example 1, except that the CIGS film was replaced with copper zinc tin sulfur selenium film and the post-treatment process of the CZTSSE film was replaced with selenization or vulcanization. A barrier layer was disposed on the cell layer. The barrier layer was EVA and glass. The protective layer of the surface of the building material was prepared by manual spraying method.

The raw materials of the protective layer of the surface of the building material comprised: based on parts by weight, 186 parts of mother liquor and 5 parts of pigment. The mother liquor comprised 45 parts of potassium water glass and 130 parts of filler, which was a mixture of talcum powder, calcium carbonate and kaolin in a weight ratio of 2:1:1. The mother liquor further comprised 0.2 part of silicone resin, 3 parts of silicone gel, 1 part of dodecanol ester, 6 parts of vinyl triamine, 20 parts of water and 0.2 part of barium sulfate light diffusing agent. 5 parts of pigment comprised titanium dioxide, iron oxide red powder, iron oxide yellow, phthalocyanine blue, mineral green and realgar. The thickness of the prepared protective layer was 2 mm. The curing temperature was 20° C. The curing time was 20 h.

Figure 15:
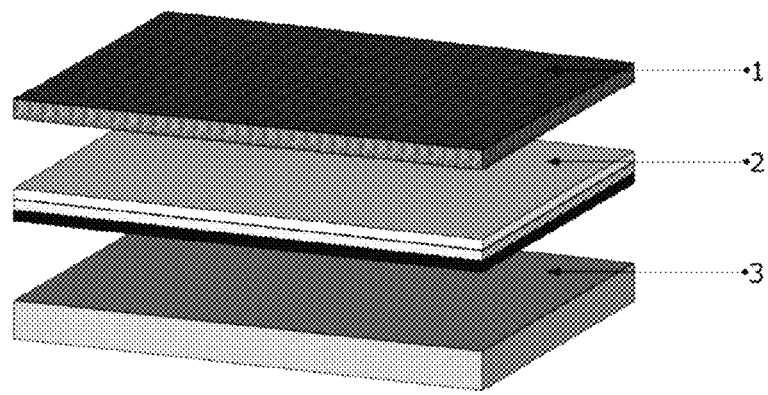
FIG. 15 is a structural diagram of a power-generating building material (comprising a front film and a glue film) of the present disclosure, in which 1 is a protective layer of the building material; 2 is a photoelectric conversion layer; and 3 is the substrate layer of the building material.
Figure 16:
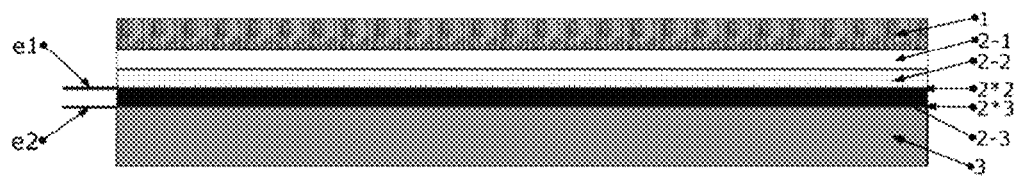
FIG. 16 is a side view of the structural diagram of the power-generating building material shown in FIG. 13, in which 1 is a protective layer of the building material; 2-1 is a front film; 2-2 is a glue film; 2-3 is a solar cell layer; 2*2 is a negative electrode surface; 2*3 is a positive electrode surface; e1 is an extracted negative electrode; e2 is an extracted positive electrode; and 3 is a substrate layer of the building material.
Figure 17:
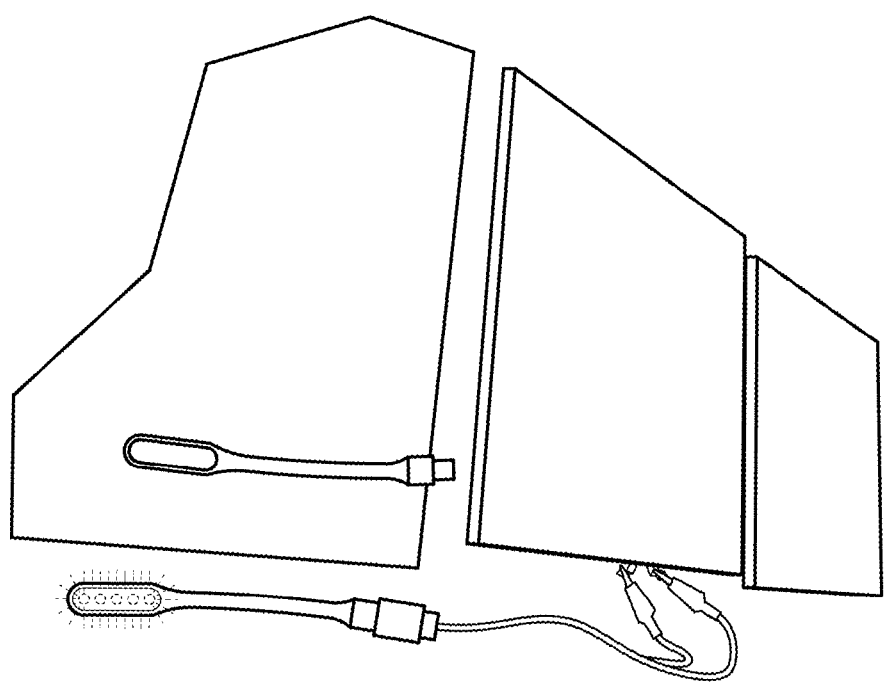
FIG. 17 is a diagram of a physical power-generating building material prepared according to the present disclosure.

The structure of the power-generating building material prepared in Example 23 was shown in FIGS. 15 and 16. The photoelectric conversion rate of the prepared power-generating building material was 7.3%.

Example 24

A photovoltaic building material comprised the substrate, which was glass and had a thickness of 8.0 mm. A photoelectric conversion layer was disposed on the substrate and had wires to extract electrodes. The photoelectric conversion layer was a CdTe solar cell. A barrier layer was disposed on the cell layer. The barrier layer was PVB and ETFE. The protective layer of the surface of the building material was arranged on the barrier layer and had a thickness of 5 mm.

The raw materials of the protective layer of the surface of the building material comprised: based on parts by weight, 100 parts of mother liquor and 5 parts of pigment. The mother liquor raw material comprises a base material, a filler and an auxiliary agent, in which the base material was 60 parts, the filler was 18 parts and the auxiliary agent was 3.8 parts. The base material comprised fluorocarbon resin. The pigment comprised mica, coral, cadmium red, iron blue and organic green. The filler comprised wollastonite powder, quartz powder and bentonite in a weight ratio of 1:1.5:0.8. The auxiliary agent comprised 0.2 part of dimethyl sulfoxide, 1.1 parts of sodium polycarboxylate, 0.3 part of emulsified silicone oil, 1.5 parts of dodecyl alcohol, 0.2 part of o-phenyl phenol and 0.5 part of methyl cellulose.

The liquid mixed raw material of the protective layer was coated on the surface of the photoelectric conversion layer in a spraying manner, and was cured at the temperature of −10° C. for 72 h to obtain the power-generating building material.

The structure of the power-generating building material prepared in Example 24 was shown in FIGS. 15 and 16. The photoelectric conversion rate of the prepared power-generating building material was 13.7%.

Example 25

A photovoltaic building material comprised a substrate, which was a polytetrafluoroethylene plate and had a thickness of 5.0 mm. A photoelectric conversion layer, which was amorphous silicon cell, was disposed on the substrate and had wires to extract electrodes. A barrier layer was disposed on the cell layer. The barrier layer was made with a silicon dioxide film and had a thickness of 5 μm. The silicon dioxide was prepared by reactive sputtering. The reactive sputtering was carried out after the vacuum chamber was pumped to pressure of $2.0 \times 10^{-3}$ Pa. The sputtering was carried out under the constant power sputtering of 600 W, the sputtering gas pressure of 0.6 Pa, the sputtering atmosphere of Ar and $O_2$, wherein Ar:$O_2$ was 3:1. The target was monocrystalline silicon with 6N purity. The target base distance was 60 mm.

The protective layer of the surface of the building material was prepared by printing method. The raw materials comprised: in parts by weight, 240 parts of mother liquor and 10 parts of pigment. The mother liquor comprised 75 parts of sodium water glass and 112 parts of filler, which was a mixture of wollastonite powder, aluminum silicate and kaolin in a weight ratio of 3:2:5 The mother liquor further comprised 0.1 part of silicone resin, 5 parts of methyl cellulose, 5 parts of dodecanol ester, 6 parts of m-phenylenediamine, 14 parts of water and 0.05 part of silicone light diffusing agent. The pigment was 10 parts of phthalocyanine pigment. The thickness of the prepared protective layer was 1 mm. The sample of the prepared protective layer of the surface of the building material was cured for 2 h at a temperature of 50° C. to obtain a power-generating building material.

The structure of the power-generating building material prepared in Example 25 was shown in FIGS. 13 and 14. The photoelectric conversion rate of the prepared power-generating building material was 8.3%.

Figure 19:
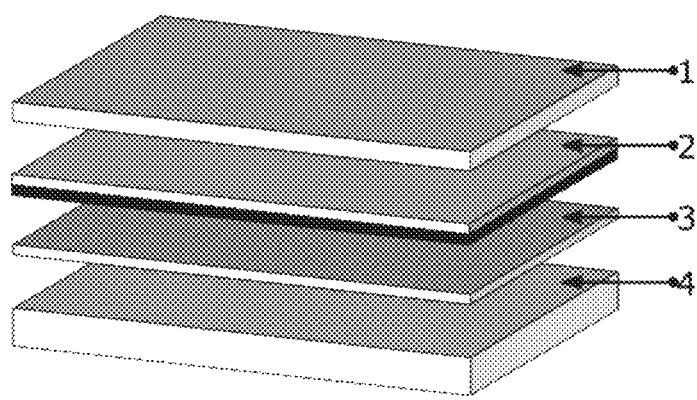
FIG. 19 is a structural diagram of a power-generating building material (comprising a ceramic film) of the present disclosure, in which 1 is a protective layer of the building material; 2 is a photoelectric conversion layer; 3 is a functional layer; and 4 is a substrate layer of the building material.
Figure 20:
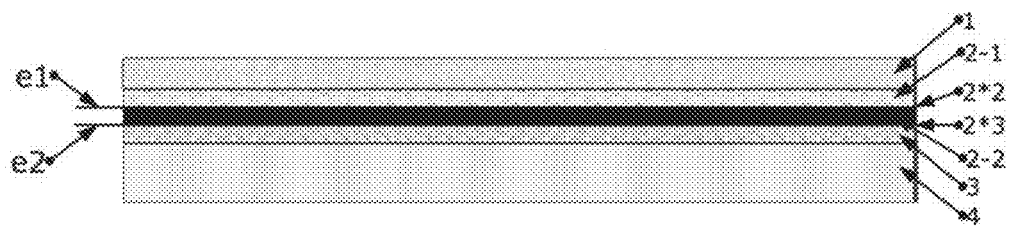
FIG. 20 is a side view of the structural diagram of the power-generating building material shown in FIG. 19, in which 1 is a protective layer of the building material; 2-1 is a ceramic film; 2-2 is a solar cell layer; 2*2 is a negative electrode surface; 2*3 is a positive electrode surface; 3 is a functional layer; 4 is a substrate layer of the building material; e1 is an extracted negative electrode; and e2 is an extracted positive electrode.

FIGS. 19 and 20 showed a novel power-generating building material.

From top to bottom, the power-generating building material sequentially comprised a protective layer of the surface of the building material, a photoelectric conversion layer, a functional layer and a substrate layer of the building material.

The photoelectric conversion layer comprised a crystalline silicon solar cell component or a thin film solar cell component, or a thin film solar cell chip or a crystalline silicon solar cell chip with a barrier layer.

The protective layer of the surface of the building material had a weighted average transmittance of 10% to 85% over a wavelength range of 300 nm to 1,300 nm. The thickness of the protective layer of the surface of the building material was 0.01 mm to 5 mm. A thicker protective layer of the surface of the building material can bring better protection effect, but can lead to reduction in the transmittance of the protective layer of the surface of the building material.

Example 26

A power-generating building material comprised a photoelectric conversion layer that was a commercially available monocrystalline silicon cell chip, a functional layer that was a PVB glue film, and a substrate layer of the building material that was a ceramic tile. The cell chip was pasted on the ceramic tile with PVB in a laminated package manner. A silicon dioxide barrier layer was arranged on the chip. The cell chip had wires to extract electrodes. The mixing solution of the raw materials of the protective layer of surface of the building material was coated on the photoelectric conversion layer by a manual spraying method. The thickness of the protective layer of surface of the building material was 2 mm. The mixing solution of the raw materials of the protective layer of surface of the building material was cured at 50° C. for 30 min to obtain the power-generating building material.

The protective layer of surface of the building material mainly comprised mother liquor and was supplemented with inorganic pigment. The mother liquor was 155 parts by weight and the pigment was 7 parts by weight. The pigment comprised the same weight of titanium dioxide and iron oxide red powder. The mother liquor comprised 764 parts of deionized water, 0.4 part of A1522 cross-linking agent, 3 parts of 250 HBR cellulose, 1.5 parts of 5040 dispersing agent, 1.5 parts of AMP-95 multifunctional auxiliary agent, 2.5 parts of M30 bactericide, 21 parts of R103 forming agent, 4 parts of ethylene glycol, 9.5 parts of C-12 film forming auxiliary agent, 0.02 part of semiconductor cerium oxide quantum dot, 0.001 part of graphene, 21 parts of soap-free polymerized silicone acrylic emulsion, 90 parts of self-crosslinking silicone acrylic emulsion copolymerized with a core-shell structure and 70 parts of silicone grafted acrylate emulsion.

The structure of the power-generating building material prepared in Example 26 was shown in FIGS. 19 and 20. The photoelectric conversion rate of the prepared power-generating building material was 15.2%.

Figure 18:
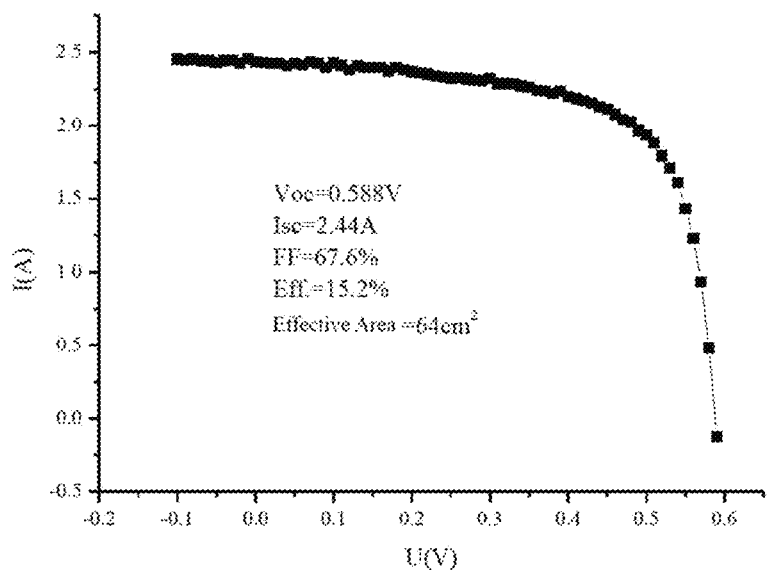
FIG. 18 is an I-V curve of the power-generating building material prepared in Example 26.

FIG. 18 showed an I-V curve of the power-generating building material prepared according to Example 26 of the present disclosure.

Example 27

A power-generating building material comprised a photoelectric conversion layer that was a commercially available polycrystalline silicon cell chip, a functional layer that was an EVA glue film, and a substrate layer of the building material that was a cement substrate. The cell chip was pasted on the cement substrate with EVA in a laminated package manner. A barrier layer of EVA and glass was arranged on the cell chip. The cell chip had wires to extract electrodes. The mixing solution of the raw materials of the protective layer of surface of the building material was coated on the photoelectric conversion layer by a printing method. The thickness of the protective layer of surface of the building material was 0.01 mm. The mixing solution of the raw materials of the protective layer of surface of the building material was cured at 100° C. for 0.1 s to obtain the power-generating building material.

Figure 21:
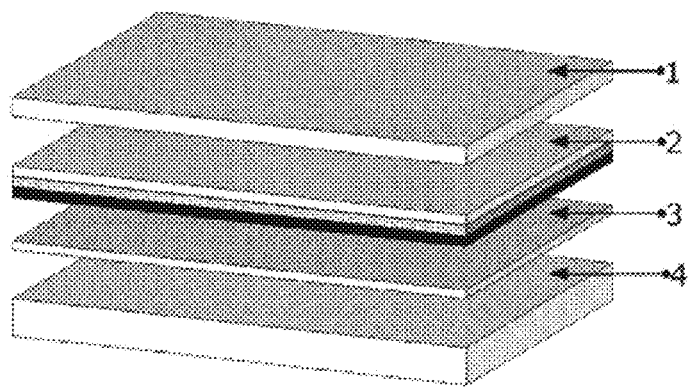
FIG. 21 is a structural diagram of a power-generating building material (comprising a front film and a glue film) of the present disclosure, in which 1 is a protective layer of the building material; 2 is a photoelectric conversion layer; 3 is a functional layer; and 4 is a substrate layer of the building material.
Figure 22:
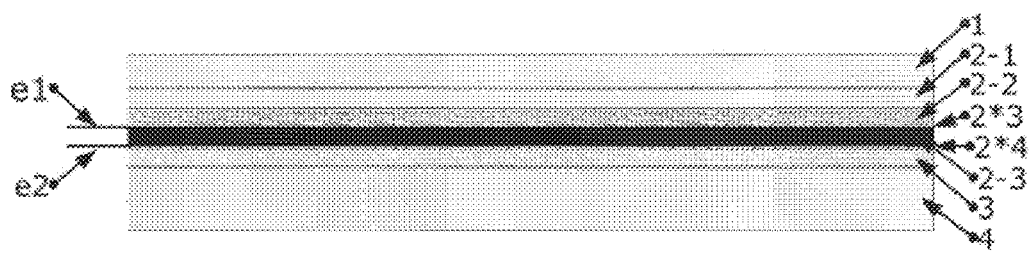
FIG. 22 is a side view of the structural diagram of the power-generating building material shown in FIG. 21, in which 1 is a protective layer of the building material; 2-1 is a front film; 2-2 is a glue film; 2-3 is a solar cell layer; 2*3 is a negative electrode surface; 2*4 is a positive electrode surface; 3 is a functional layer; 4 is a substrate layer of the building material; e1 is an extracted negative electrode; and e2 is an extracted positive electrode.

The pigment was 186 parts by weight and the pigment was for 5 parts by weight. The mother liquor comprised 45 parts of potassium water glass and 130 parts of filler, which was a mixture of talcum powder, calcium carbonate and kaolin in a weight ratio of 2:1:1. The mother liquor further comprised 0.2 part of silicone resin, 3 parts of silicone gel, 1 part of dodecanol ester, 6 parts of vinyl triamine, 20 parts of water and 0.2 part of barium sulfate light diffusing agent. 5 parts of pigment comprised a mixture of mineral green and realgar in a weight ratio of 1:3. The structure of the power-generating building material prepared in Example 27 was shown in FIGS. 21 and 22. The photoelectric conversion rate of the prepared power-generating building material was 16.1%.

Example 28

A power-generating building material comprised a photoelectric conversion layer that was a commercially available monocrystalline silicon cell component, a functional layer that was an EVA glue film, and a substrate layer of the building material that was a tile. The component was pasted on the tile with EVA in a laminated package manner. The photoelectric conversion layer had wires to extract electrodes. The mixing solution of the raw materials of the protective layer of surface of the building material was coated on the component by a silk-screen printing method. The thickness of the protective layer of surface of the building material was 0.5 mm. The mixing solution of the raw materials of the protective layer of surface of the building material was cured at 30° C. for 4 h to obtain the power-generating building material.

The raw material of the protective layer of the surface of the building material comprised: in parts by weight, 100 parts of mother liquor and 5 parts of pigment. The raw material of the mother liquor comprised a base material, a filler and an auxiliary agent, in which the base material was 60 parts, the filler was 18 parts and the auxiliary agent was 3.8 parts. The base material comprised fluorocarbon resin. The pigment was a natural mineral pigment. The natural mineral pigment comprised mica and coral. The filler comprised wollastonite powder, quartz powder and bentonite in a weight ratio of 1:1.5:0.8. The auxiliary agent comprised 0.2 part of dimethyl sulfoxide, 1.1 parts of sodium polycarboxylate, 0.3 part of emulsified silicone oil, 1.5 parts of dodecyl alcohol, 0.2 part of o-phenyl phenol and 0.5 part of methyl cellulose.

Figure 23:
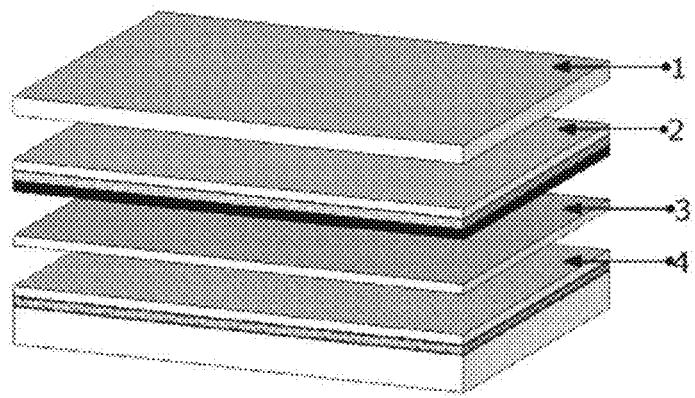
FIG. 23 is a structural diagram of a power-generating building material (comprising a front film, a glue film and two substrate layers) of the present disclosure, in which 1 is a protective layer of the building material; 2 is a photoelectric conversion layer; 3 is a functional layer; and 4 is a substrate layer of the building material.
Figure 24:
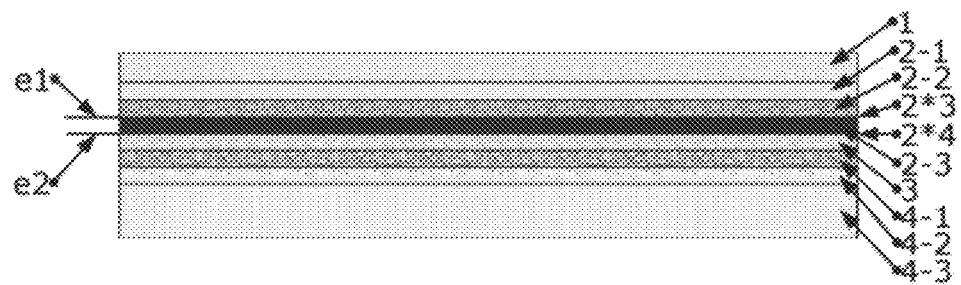
FIG. 24 is a side view of the structural diagram of the power-generating building material shown in FIG. 23, in which 1 is a protective layer of the building material; 2-1 is a front film; 2-2 is a glue film; 2-3 is a solar cell layer; 2*3 is a negative electrode surface; 2*4 is a positive electrode surface; 3 is a functional layer; 4-1 is a first substrate layer; 4-2 is a glue film; 4-3 is a second substrate layer; e1 is an extracted negative electrode; and e2 is an extracted positive electrode.

The structure of the power-generating building material prepared in Example 28 was shown in FIGS. 23 and 24. The photoelectric conversion rate of the prepared power-generating building material was 16.3%.

Example 29

A power-generating building material comprised a photoelectric conversion layer that was a commercially available copper indium gallium selenide cell component, a functional layer that was PVB, and a substrate layer of the building material that was a polytetrafluoroethylene plate. The component was pasted on the polytetrafluoroethylene plate with PVB in a laminated package manner. The photoelectric conversion layer had wires to extract electrodes. The mixing solution of the raw materials of the protective layer of surface of the building material was coated on the photoelectric conversion layer by a spraying method. The thickness of the protective layer of surface of the building material was 5 mm. The mixing solution of the raw materials of the protective layer of surface of the building material was cured at −10° C. for 72 h to obtain the power-generating building material.

The mother liquor was 240 parts by weight and pigment was 10 parts by weight. The mother liquor comprised 75 parts of sodium water glass and 112 parts of filler, which was a mixture of wollastonite powder, aluminum silicate and kaolin in a weight ratio of 3:2:5. The mother liquor further comprised 0.1 part of silicone resin, 5 parts of methyl cellulose, 5 parts of dodecanol ester, 6 parts of m-phenylene-diamine, 14 parts of water and 0.05 part of silicone light diffusing agent. 10 parts of pigment was phthalocyanine pigment.

Figure 25:
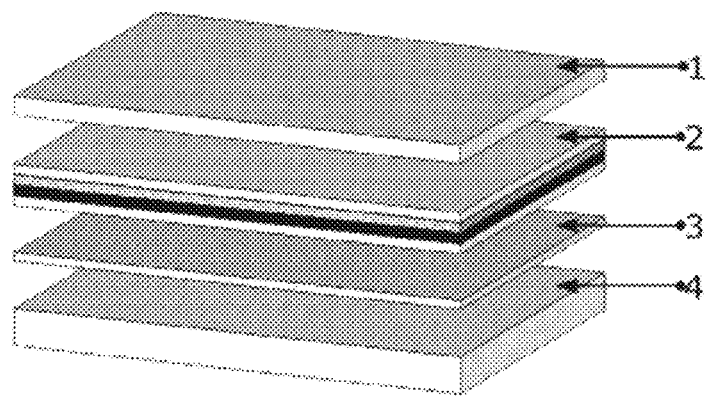
FIG. 25 is a structural diagram of a power-generating building material (comprising a front film, a glue film and two substrate layers) of the present disclosure, in which 1 is a protection layer of the building material; 2 is a photoelectric conversion layer; 3 is a glue film, and 4 is a substrate layer of the building material.
Figure 26:
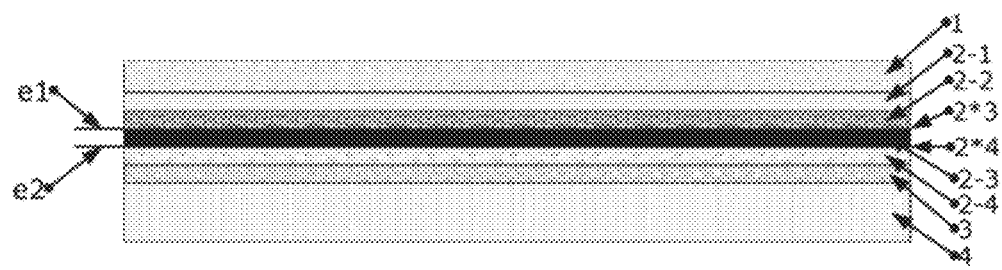
FIG. 26 is a side view of the structural diagram of the power-generating building material shown in FIG. 25, in which 1 is a protective layer of the building material; 2-1 is a front film; 2-2 is a glue film; 2-3 is a solar cell layer; 2-4 a first substrate layer; 2*3 is a negative electrode surface; 2*4 is a positive electrode surface; 3 is a glue film; 4 is a substrate layer of the building material; e1 is an extracted negative electrode; and e2 is an extracted positive electrode.
Figure 27:
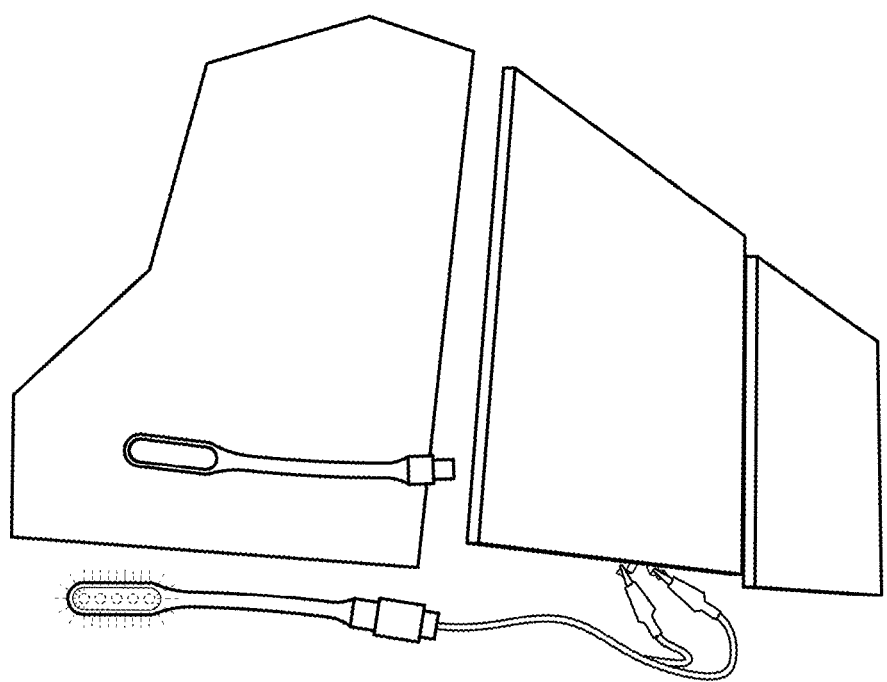
FIG. 27 is a diagram of a physical power-generating building material prepared according to the present disclosure.

The structure of the power-generating building material prepared in Example 29 was shown in FIGS. 25 and 26. The photoelectric conversion rate of the prepared power-generating building material was 12.3%.

Example 30

A power-generating building material comprised a photoelectric conversion layer that was a commercially available amorphous silicon thin film cell component, a functional layer that was EVA, and a substrate layer of the building material that was a stainless steel plate substrate. The component was pasted on the stainless steel plate substrate with EVA in a laminated package manner. The photoelectric conversion layer had wires to extract electrodes. The mixing solution of the raw materials of the protective layer of surface of the building material was coated on the photoelectric conversion layer by a spraying method. The thickness of the protective layer of surface of the building material was 3 mm. The mixing solution of the raw materials of the protective layer of surface of the building material was cured at 50° C. for 1 h to obtain the power-generating building material.

The protective layer of surface of the building material was prepared by an automatic spraying method. The raw materials comprised a mother liquor and a pigment, in which the mother liquor was 70 parts by weight and the pigment was 10 parts by weight. The raw materials of the mother liquor comprised a base material, a filler and an auxiliary agent, in which the base material was 70 parts, the filler was 30 parts and the auxiliary agent was 6 parts. The base material comprised fluorocarbon resin. The pigment comprised an artificial pigment. The artificial pigment was iron blue. The filler comprised quartz powder and precipitated barium sulfate. The auxiliary agent comprised 0.4 part of glycerin, 1.0 part of sodium polycarboxylate, 0.4 part of polyoxyethylene polyoxypropylene ether, 2 parts of dodecyl alcohol, 0.1 part of ammonium persulfate and 0.6 part of hydroxypropyl methyl cellulose.

The structure of the power-generating building material prepared in Example 30 was shown in FIGS. 25 and 26. The photoelectric conversion rate of the prepared power-generating building material was 8.3%.

Figure 29:
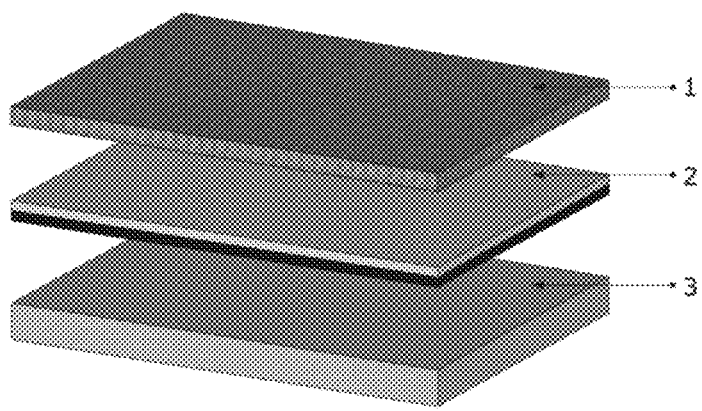
FIG. 29 is a structural diagram of a power-generating building material (comprising a ceramic film) of the present disclosure, in which 1 is a surface layer; 2 is a photoelectric conversion device; and 3 is a substrate layer.
Figure 30:
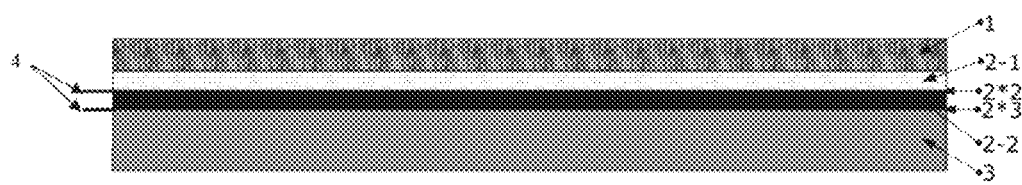
FIG. 30 is a side view of the structural diagram of the power-generating building material shown in FIG. 29, in which 1 is a surface layer; 2-1 is a ceramic film; 2-2 is a solar cell layer; 2*2 is a photogenerated electron collection front electrode; 2*3 is a photogenerated hole collection back electrode; and 4 is a pair of electrodes.

FIGS. 29 and 30 showed a structural diagram of a power-generating building material.

The power-generating building material comprised a surface layer, a photoelectric conversion device, a substrate layer and an electrode.

The surface layer consisted of an optical dielectric material with an atomization scattering effect and a texture phase.

The photoelectric conversion device sequentially comprised a photogenerated hole collection back electrode, a photogenerated carrier layer, a photogenerated electron collection front electrode and a barrier layer, in which the back electrode and the front electrode are provided with a current collection device. The current collection device is electrically connected with the electrode.

The substrate layer was an engineering structural plate and comprised one or more of glass, metal plate, cement-based fiber board, flexible plastic film and ceramic tile.

The electrode comprised at least one pair of positive and negative electrodes and one bypass diode. The electrode was connected with the system circuit by socket, plug, or junction box.

Example 31

A power-generating building material comprised a substrate, which was a flexible stainless steel foil and had a thickness of 0.2 mm. The flexible stainless steel foil was cleaned. A WTi barrier layer, a Mo electrode, a copper indium gallium selenide film layer, a cadmium sulfide buffer layer, an intrinsic zinc oxide and an AZO light-transmitting front electrode were sequentially prepared on the flexible stainless steel foil to form a CIGS solar cell. The positive and negative electrodes of the solar cell were extracted by screen printing current collection grid lines, bus bars and the like. The positive and negative electrodes of the power-generating building materials were electrically connected. A 3 μm aluminum nitride was then prepared on the CIGS surface as a barrier layer. Finally, a 1 mm surface layer was prepared on the barrier layer with a printing method. The prepared surface layer can be completely cured after standing for 10 min at 90° C. to obtain the power-generating building material.

The raw material of the surface layer of the power-generating building material comprised a pigment and a base material and comprised in parts by weigh, 7 parts of pigment, in which the pigment comprised mineral green, carbon black, iron oxide red, iron blue, pearlescent silver, quinacridone and isoindoline. The base material comprised 764 parts of deionized water, 0.4 parts of A1522 cross-linking agent, 3 parts of 250HBR cellulose, 1.5 parts of 5040 dispersing agent, 1.5 parts of AMP-95 multifunctional auxiliary agent, 2.5 parts of M30 bactericide, 21 parts of R103 forming agent, 4 parts of ethylene glycol, 9.5 parts of C-12 film forming auxiliary agent, 0.1 part of silicone light diffusing agent, 1 part of polymethyl methacrylate sphere with a diameter of 0.8 μm, 21 parts of a soap-free polymerized silicone acrylic emulsion and 70 parts of self-cross-linking silicone acrylic emulsion formed copolymerized with a core-shell structure.

The structure of the power-generating building material prepared in Example 31 was shown in FIGS. 29 and 30. The photoelectric conversion rate of the prepared power-generating building material was 14.8%.

Figure 28:
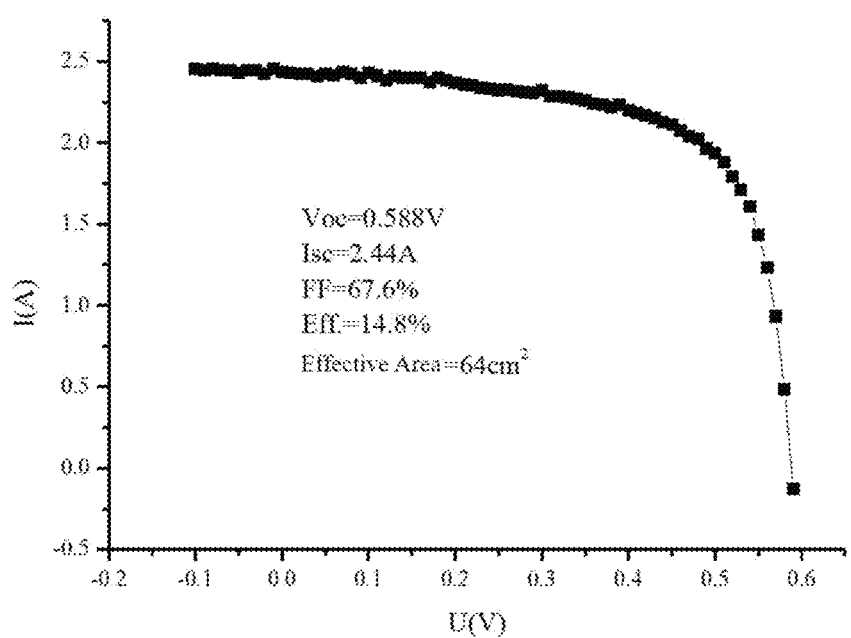
FIG. 28 is an I-V curve of the power-generating building material prepared in Example 31.

FIG. 28 showed an I-V curve of the power-generating building material prepared according to the present Example.

Example 32

A power-generating building material comprised a substrate, which was a glass and had a thickness of 2.0 mm. The glass substrate was cleaned. A WTi barrier layer, a Mo electrode, a copper indium gallium selenide film layer, a cadmium sulfide buffer layer, an intrinsic zinc oxide and an AZO light-transmitting front electrode were sequentially prepared on the glass substrate to form a CZTSe solar cell. The positive and negative electrodes of the solar cell were extracted by screen printing current collection grid lines, bus bars and the like. The positive and negative electrodes of the power-generating building materials were electrically connected. The CZTSe solar cell were provided with PVB and glass as a barrier layer. Finally, a 0.01 mm surface layer was prepared on the barrier layer with a printing method. The prepared surface layer can be completely cured after standing for 0.1 s at 60° C. to obtain the power-generating building material.

The raw material of the surface layer comprised: in parts by weight, 45 parts of potassium water glass, 130 parts of filler, which was a mixture of talcum powder, calcium carbonate and kaolin in a weight ratio of 2:1:1, 1 part of polymethyl methacrylate sphere with diameter of 1 μm and nano-sized barium carbonate, 3 part of silica gel, 1 part of dodecanol ester, 6 parts of vinyltriamine, 20 parts of water, and 0.2 part of barium sulfate light diffusing agent. 0.5 part of silicone and 5 parts of pigment. The pigment comprised carbon black, oxygen, phthalocyanine, benzimidazole ketone, pyrone, mineral green and realgar.

Figure 31:
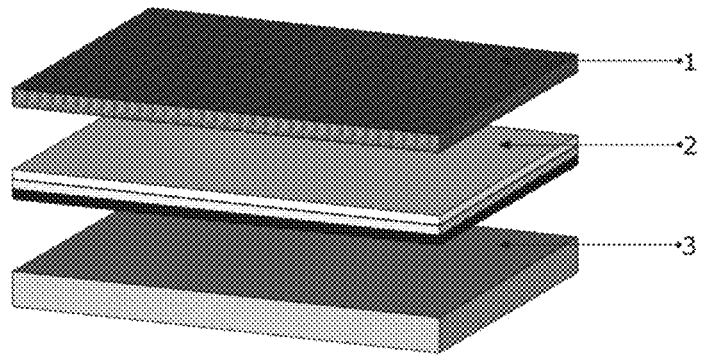
FIG. 31 is a structural diagram of a power-generating building material (comprising a front film and a glue film) of the present disclosure, in which 1 is a surface layer; 2 is a photoelectric conversion device; and 3 is a substrate layer.
Figure 32:
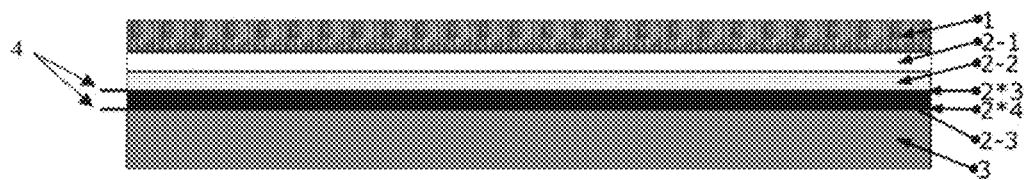
FIG. 32 is a side view of the structural diagram of the power-generating building material shown in FIG. 31, in which 1 is a surface layer; 2-1 is a front film; 2-2 is a glue film; 2-3 is a solar cell layer; 2*3 is a photogenerated electron collection front electrode; 2*4 is a photogenerated hole collection back electrode; and 4 is a pair of electrodes.

The structure of the prepared power-generating building material was shown in FIGS. 31 and 32. The photoelectric conversion rate of the prepared power-generating building material was 5.8%.

Example 33

A power-generating building material comprised a substrate, which was a ceramic tile and had a thickness of 8.0 mm. The ceramic tile was cleaned and dried. A commercially available CdTe solar cell chip was attached to the surface of the ceramic tile in a laminating package manner. A 5 μm silicon dioxide barrier layer was prepared on the surface of the solar cell chip. The electrode of the chip was connected with the electrode of the power-generating building material. Finally, a 3 mm surface layer was prepared on the barrier layer in a mechanical spraying manner. The prepared surface layer can be completely cured at 50° C. for 4 h to obtain the power-generating building material.

The raw materials of the surface layer of the building material comprised a base material, a filler and an auxiliary agent, in which the base material was 60 parts by weight, the filler was 18 parts by weight and the auxiliary agent was 3.8 parts by weight. The base material comprised fluorocarbon resin. The filler comprised wollastonite powder, quartz powder and bentonite in a weight ratio of 1:1.5:0.8. The auxiliary agent comprised 0.2 part of dimethyl sulfoxide, 1.1 parts of sodium polycarboxylate, 0.3 part of emulsified silicone oil, 1.5 parts of dodecyl alcohol, 0.2 part of o-phenylphenol and 0.5 part of methyl cellulose. The raw material of the surface layer further comprised 5 parts of pigment and 5 parts of polystyrene sphere with diameter of 1 μm and nano-sized barium carbonate. The pigment comprised iron oxide yellow, chrome yellow, iron blue, pearlescent silver, isoindoline, anthrapyrimidine and acetoacetamide.

Figure 33:
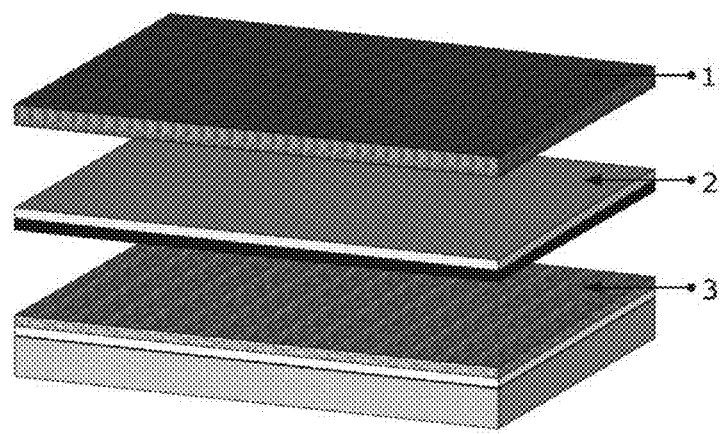
FIG. 33 is a structural diagram of a power-generating building material (comprising a ceramic film) of the present disclosure, in which 1 is a surface layer; 2 is a photoelectric conversion device; and 3 is a substrate layer.
Figure 34:
FIG. 34 is a side view of the structural diagram of the power-generating building material shown in FIG. 33, in which 1 is a surface layer; 2-1 is a ceramic film; 2-2 is a solar cell layer; 3-1 is a first substrate layer; 3-2 is a glue film; 3-3 is a second substrate layer; 2*3 is a photogenerated electron collection front electrode; 2*4 is a photogenerated hole collection back electrode; and 4 is a pair of electrodes.

The structure of the prepared power-generating building material was shown in FIGS. 33 and 34. The photoelectric conversion rate of the prepared power-generating building material was 13.8%.

Example 34

A power-generating building material comprised a substrate, which was a polytetrafluoroethylene plate and had a thickness of 3.0 mm. The polytetrafluoroethylene plate was cleaned and dried. A commercially available copper indium gallium selenide solar cell component was attached to the surface of the polytetrafluoroethylene plate in a laminating package manner. The electrode of the component was connected with the electrode of the power-generating building material. As the surface of the commercially available copper indium gallium selenide solar cell component was provided with PVB and glass, the copper indium gallium selenide solar cell component can be used as a barrier layer. Finally, a 1 mm surface layer was prepared on the barrier layer in a manual spraying manner. The prepared surface layer can be completely cured at 30° C. for 20 h to obtain the power-generating building material.

The raw materials of the surface layer of the building material comprised: in parts by weight, 75 parts of sodium water glass, 112 parts of filler, which was a mixture of wollastonite powder, aluminum silicate and kaolin in a weight ratio of 3:2:5, 3 parts of polymethyl methacrylate and nano-sized titanium dioxide, 0.1 part of silicone resin, 5 parts of methyl cellulose, 5 parts of dodecanol ester, 6 parts of m-phenylenediamine, 14 parts of water, 0.8 part of polymethyl methacrylate sphere with diameter of 1 μm and nano-sized barium carbonate and 10 parts of pigment. The pigment comprised mineral green, iron oxide red, iron oxide yellow, iron blue, pearl silver and pearlite.

Figure 35:
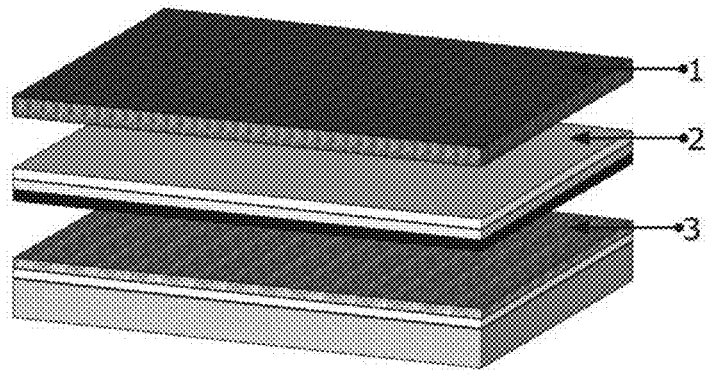
FIG. 35 is a structural diagram of a power-generating building material (comprising a front film and a glue film) of the present disclosure, in which 1 is a surface layer; 2 is a photoelectric conversion device; and 3 is a substrate layer.
Figure 36:
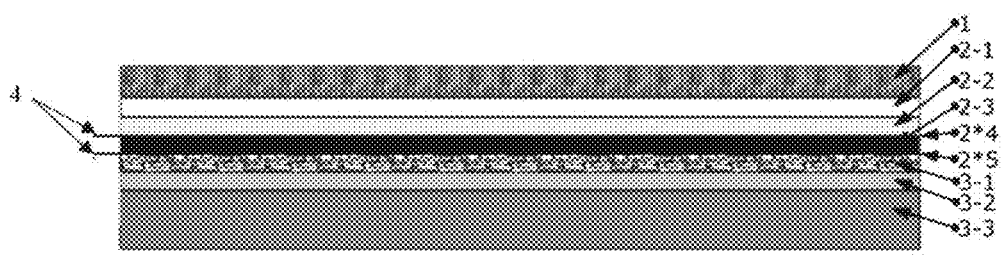
FIG. 36 is a side view of the structural diagram of the power-generating building material shown in FIG. 35, in which 1 is a surface layer; 2-1 is a front film; 2-2 is a glue film; 2-3 is a solar cell layer; 3-1, a first substrate layer; 3-2 is a glue film; 3-3 is a second substrate layer; 2*4 is a photogenerated electron collection front electrode; 2*5 is a photogenerated hole collection back electrode; and 4 is a pair of electrodes.

The structure of the prepared power-generating building material was shown in FIGS. 35 and 36. The photoelectric conversion rate of the prepared power-generating building material was 13.1%.

Example 35

A power-generating building material comprised a substrate, which was an aluminum nitride ceramic plate and had a thickness of 5.0 mm. The aluminum nitride ceramic plate was cleaned and dried. A commercially available monocrystalline silicon solar cell component was attached to the surface of the aluminum nitride ceramic plate in a laminating package manner. The electrode of the component was connected with the electrode of the power-generating building material. As the surface of the commercially available monocrystalline silicon solar cell component was provided with PVB and ETFE, the monocrystalline silicon solar cell component can be used as a barrier layer. Finally, a 5 mm surface layer was prepared on the barrier layer in a slurry manner. The prepared surface layer can be completely cured at −10° C. for 72 h to obtain the power-generating building material.

Figure 37:
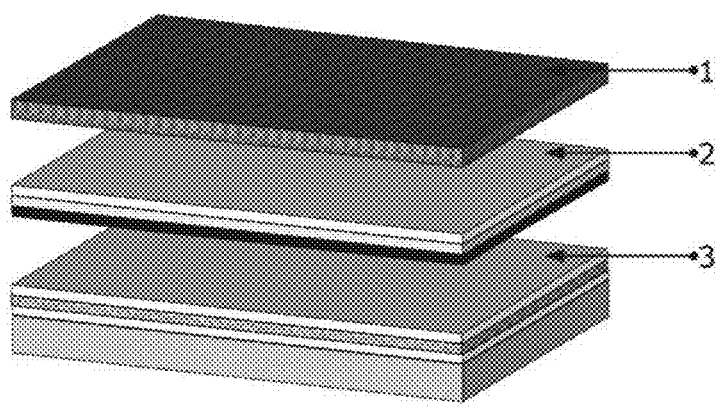
FIG. 37 is a structural diagram of a power-generating building material (comprising a front film and a glue film) of the present disclosure, in which 1 is a surface layer; 2 is a photoelectric conversion device; and 3 is a substrate layer.
Figure 38:
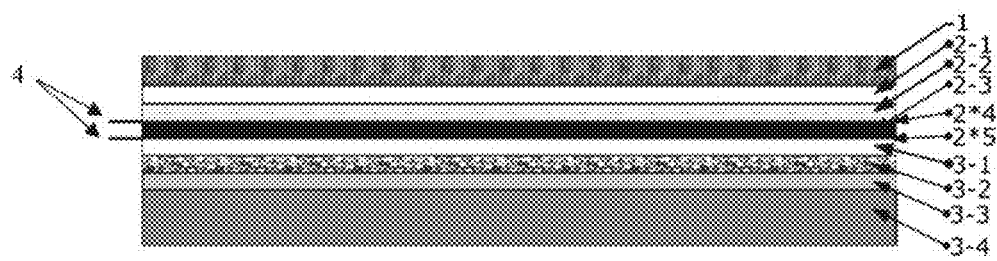
FIG. 38 is a side view of the structural diagram of the power-generating building material shown in FIG. 37, in which 1 is a surface layer; 2-1 is a front film; 2-2 is a glue film; 2-3 is a solar cell layer; 3-1 is a glue film; 3-2 is a first substrate; 3-3 is a glue film; 3-4 is a second substrate; 2*4 is a photogenerated electron collection front electrode; 2*5 is a photogenerated hole collection back electrode; and 4 is a pair of electrodes.

The raw materials of the surface layer of the building material comprised a base material, a filler, an auxiliary agent and a pigment, in which the base material was 70 parts by weight, the filler was 10 parts by weight, the auxiliary agent was 6 parts by weight, and the pigment was 1 part by weight. The base material comprised a fluorocarbon resin. The pigment comprised iron blue, pearlescent silver, pearlite, phthalocyanine, benzimidazolone, and pyrone. The filler comprised quartz powder and precipitated barium sulfate. The auxiliary agent comprises 0.4 part of glycerin, 1.0 part of sodium polycarboxylate, 0.4 part of polyoxyethylene polyoxypropylene ether, 2 parts of dodecyl alcohol, 0.1 part of ammonium persulfate, 0.6 part of hydroxypropyl methyl cellulose, 2 parts of polystyrene sphere with diameter of 1 μm and nano-sized silicon dioxide. The structure of the prepared power-generating building material was shown in FIGS. 37 and 38. The photoelectric conversion rate of the prepared power-generating building material was 15.9%.

Example 36

A power-generating building material comprised a substrate, which was a glass and had a thickness of 3.0 mm. The polycrystalline silicon solar cell component was cleaned and dried. As the surface of the commercially available polycrystalline silicon solar cell component was provided with PVB and glass, the polycrystalline silicon solar cell component can be used as a barrier layer. Finally, a 2 mm surface layer was prepared on the barrier layer in a manual blade coating manner. The prepared surface layer can be completely cured at 40° C. for 15 h to obtain the power-generating building material.

Figure 39:
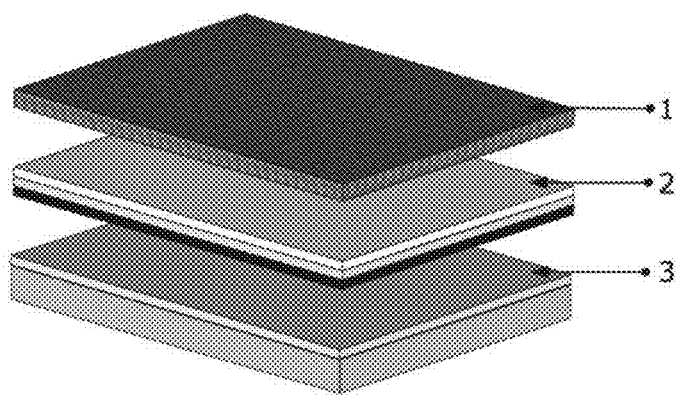
FIG. 39 is a structural diagram of a power-generating building material (comprising a front film and a glue film) of the present disclosure, in which 1 is a surface layer; 2 is a photoelectric conversion device; and 3 is a substrate layer.
Figure 40:
FIG. 40 is a side view of the structural diagram of the power-generating building material shown in FIG. 39, in which 1 is a surface layer; 2-1 is a front film; 2-2 is a glue film; 2-3 is a solar cell layer; **2\*3 is a photogenerated electron collection front electrode; 2\*4 is a photogenerated hole collection back electrode; 3-1 is a glue film; 3-2 is a substrate layer; and 4** is a pair of electrodes.

The mother liquor comprised: in parts by weight, 800 parts of deionized water, 0.3 parts of A151 cross-linking agent, 2 parts of 250HBR cellulose, 0.5 parts of 5040 dispersing agent, 3 parts of AMP-95 multifunctional auxiliary agent, 1 part of M30 bactericide, 15 parts of R103 forming agent, 6 parts of ethylene glycol, 8 parts of C-12 film forming auxiliary agent, 0.1 part of nano-sized silicon dioxide light diffusing agent, 28 parts of soap-free polymerized silicone acrylic emulsion, 70 parts of self-crosslinking silicone acrylic emulsion copolymerized with a core-shell structure and 110 parts of silicone grafted acrylate emulsion. The raw material of the surface layer further comprised a pigment. The pigment comprised 1 part of iron oxide yellow, chrome yellow, iron blue phthalocyanine, benzimidazole ketone, isoindoline and anthrapyrimidine. The raw material of the surface layer further comprised 7 parts of polystyrene spheres with diameter of 1 μm and nano-sized calcium carbonate. The structure of the prepared power-generating building material was shown in FIGS. 39 and 40. The photoelectric conversion rate of the prepared power-generating building material was 17.9%.

It should be noted that the above embodiments are merely illustrating rather than limiting the technical solutions of the present disclosure. Although the disclosure has been described in detail herein with reference to the embodiments, one skilled in the art should understand that modifications and equivalent replacements of the technical solution of the present disclosure without departing from the spirit and scope of the technical solutions of the present disclosure will fall within the scope of the claims.

What is claimed is:

1. A power-generating panel, comprises a substrate, a power-generating layer and an optical adjustment layer,
   wherein the optical adjustment layer comprises an optical medium phase and a texture phase, wherein the texture phase is dispersed in the optical medium phase or the texture phase is distributed on a surface of the optical medium phase, and wherein the texture phase comprises one or more of marble, granite, shale and sandstone; and
   wherein the optical adjustment layer has a weighted average transmittance of 40% to 85% in a wavelength range of 380 nm to 1,250 nm, a thickness of 0.01 mm to 10 mm, a percentage of water vapor permeating through the optical adjustment layer of 0% to 0.5%, and a hardness of 4 to 9H.

2. The power-generating panel of claim 1, wherein the optical medium phase comprises one or more of quartz, glass, resin, transparent ceramic and crystal material.

3. The power-generating panel of claim 1, wherein the optical adjustment layer comprises one or more of color-glazed glass, ultra-thin stone and artificial light-transmitting resin plate.

4. The power-generating panel of claim 1, wherein the optical medium phase of the optical adjustment layer comprises a light diffusing agent.

5. The power-generating panel of claim 1, wherein the texture phase further comprises a coloring material.

6. The power-generating panel of claim 5, wherein the coloring material comprises one or more of strontium sulfide, cerium oxide, cobalt oxide, silver, copper oxide, cuprous oxide, iron oxide, manganese oxide and selenium oxide.

7. The power-generating panel of claim 5, wherein the coloring material comprises one or more of pigment and dye.

8. The power-generating panel of claim 7, wherein a refractive index of the pigment is 1.4 to 2.5.

\* \* \* \* \*